United States Patent
Kirby

(10) Patent No.: US 11,587,895 B2
(45) Date of Patent: Feb. 21, 2023

(54) SEMICONDUCTOR INTERCONNECT STRUCTURES WITH VERTICALLY OFFSET BONDING SURFACES, AND ASSOCIATED SYSTEMS AND METHODS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 17/236,425

(22) Filed: Apr. 21, 2021

(65) Prior Publication Data

US 2022/0344294 A1    Oct. 27, 2022

(51) Int. Cl.
*H01L 23/00* (2006.01)
*H01L 25/065* (2006.01)
*H01L 25/00* (2006.01)

(52) U.S. Cl.
CPC ............ *H01L 24/08* (2013.01); *H01L 24/05* (2013.01); *H01L 24/80* (2013.01); *H01L 25/0657* (2013.01); *H01L 25/50* (2013.01); *H01L 2224/05557* (2013.01); *H01L 2224/08146* (2013.01); *H01L 2224/80143* (2013.01)

(58) Field of Classification Search
CPC ......... H01L 24/08; H01L 24/05; H01L 24/80; H01L 25/0657; H01L 25/50; H01L 2224/05557; H01L 2224/08146; H01L 2224/80143
See application file for complete search history.

(56) References Cited

U.S. PATENT DOCUMENTS

| | | | | |
|---|---|---|---|---|
| 11,362,052 B2* | 6/2022 | Lee | ......................... | H01L 24/03 |
| 11,362,053 B2* | 6/2022 | Jeong | ...................... | H01L 24/05 |
| 2019/0109042 A1* | 4/2019 | Katkar | .................... | H01L 24/08 |
| 2020/0058669 A1* | 2/2020 | Chen | .................... | H01L 27/1157 |
| 2020/0395328 A1* | 12/2020 | Fastow | ............ | H01L 27/11582 |
| 2021/0098360 A1* | 4/2021 | Chandhok | .............. | H01L 24/80 |
| 2021/0098412 A1* | 4/2021 | Haba | .................. | H01L 23/3107 |
| 2021/0159163 A1* | 5/2021 | Lift | ....................... | H01L 21/768 |
| 2021/0305200 A1* | 9/2021 | Lin | ..................... | H01L 25/0657 |
| 2021/0398957 A1* | 12/2021 | Lan | ......................... | H01L 24/05 |
| 2022/0093461 A1* | 3/2022 | Chung | .................. | H01L 23/498 |
| 2022/0189888 A1* | 6/2022 | Lai | .......................... | H01L 24/94 |

* cited by examiner

*Primary Examiner* — Mamadou L Diallo
(74) *Attorney, Agent, or Firm* — Perkins Coie LLP

(57) ABSTRACT

Semiconductor devices having interconnect structures with vertically offset bonding surfaces, and associated systems and methods, are disclosed herein. In one embodiment, a semiconductor device includes a semiconductor substrate at least partially covered by a first dielectric material having an upper surface, and an interconnect structure extending therefrom. The interconnect structure can include a plurality of conductive elements, and a continuous region of a first insulating material at least partially between the plurality of conductive elements. The plurality of conductive elements and the continuous region can have coplanar end surfaces. The interconnect structure can further include a perimeter structure at least partially surrounding the plurality of conductive elements and the continuous region. The perimeter structure can have an uppermost surface that can be vertically offset from the upper surface of the first dielectric material and/or the coplanar end surfaces.

20 Claims, 15 Drawing Sheets

SEMICONDUCTOR INTERCONNECT STRUCTURES WITH VERTICALLY OFFSET BONDING SURFACES, AND ASSOCIATED SYSTEMS AND METHODS

TECHNICAL FIELD

The present technology generally relates to semiconductor devices, and more particularly relates to semiconductor devices having interconnect structures with vertically offset bonding surfaces configured to have improved bonding characteristics.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher-level circuitry.

One approach for bonding individual semiconductor devices to form semiconductor packages is hybrid bonding. During typical hybrid bonding processes, oxide-oxide bonds form between corresponding oxide bonding zones. The temperature and high strength of the oxide-oxide bonds can induce compression to facilitate forming metal-metal bonds between corresponding metal bonding zones. However, it can be difficult to align the oxide and metal bonding zones of a first device with the corresponding oxide and metal bonding zones of a second device. Often, these corresponding bonding zones can be misaligned, which can render the semiconductor packages inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
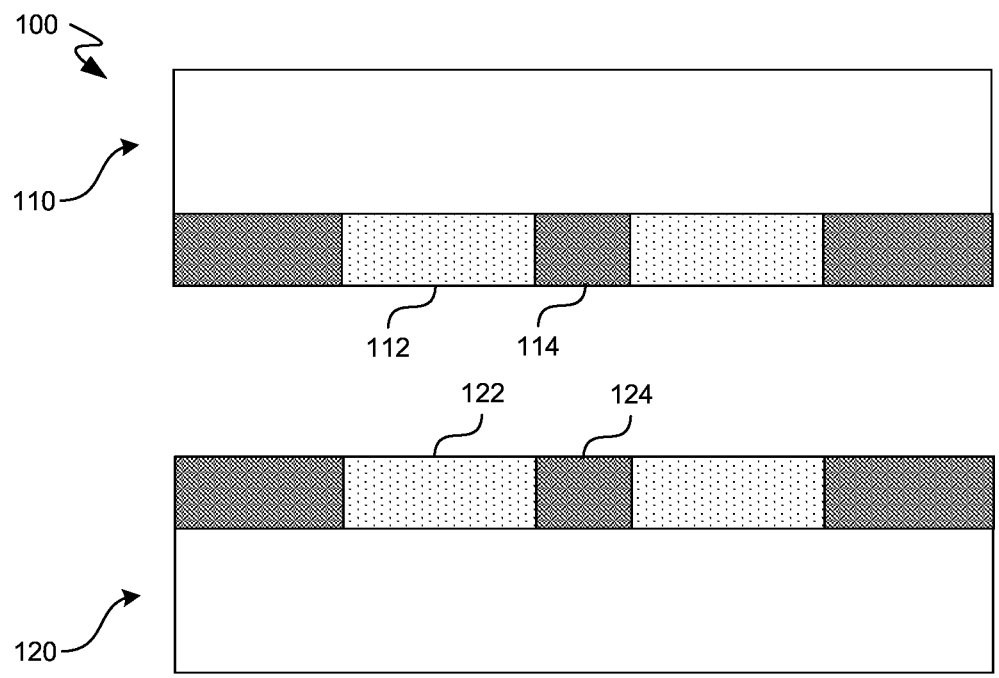
FIGS. 1A-1B are side cross-sectional views of two semiconductor devices at various stages of a hybrid bonding process.

As set forth above, conventional hybrid bonding operations can be difficult to align, and moreover can fail when insufficient surface area is available to form mechanically robust oxide-oxide bonds. Embodiments of the present technology address the foregoing drawbacks by providing semiconductor devices with three-dimensional hybrid-bonding interconnect structures that include additional surface area for oxide bonding and facilitate mechanical alignment. For example, a semiconductor device can include a semiconductor substrate and a dielectric layer formed over the substrate. The dielectric layer can have an upper surface positioned away from the semiconductor substrate. The semiconductor device can further include an interconnect structure disposed at least partially in the dielectric layer. The interconnect structure can include a plurality of conductive elements electrically coupled to circuitry in the semiconductor substrate, and each one of the plurality of conductive elements can have an end surface that is coplanar with the other end surfaces. The interconnect structure can further include a continuous region of a first insulating material at least partially between the plurality of conductive elements. The continuous region can have an uppermost surface that can be coplanar with the coplanar end surfaces of the plurality of conductive elements. The interconnect structure can further include a perimeter structure of a second insulating material surrounding the plurality of conductive elements and the region of the first insulating material. The perimeter structure can have an uppermost surface that can be vertically offset from either the coplanar end surfaces (e.g., of the plurality of conductive elements and continuous region) or the upper surface of the dielectric layer. In some embodiments, the perimeter structure can further include a lateral surface positioned between the uppermost surface and the dielectric layer. The lateral surface can be perpendicular to the uppermost surface and/or the dielectric layer. The interconnect structures of the present technology are expected to provide more consistent alignment of bonding components and/or increased bonding strength. The vertically offset surfaces can provide a mechanical coupling (e.g., male-female, plug and socket, etc.) that can both increase bond strength and provide alignment for bonding components (e.g., the perimeter structure, plurality of conductive elements, dielectric layer, etc.). Semiconductor devices configured in accordance with the present technology can also have increased surface area available for bonding (e.g., the vertically offset uppermost surface of the perimeter structure), which can further increase bond strength as a result of having more material available for bonding.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using semiconductor-manufacturing techniques whose details are well known to those of skill in the art.

Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 2-8. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1B:
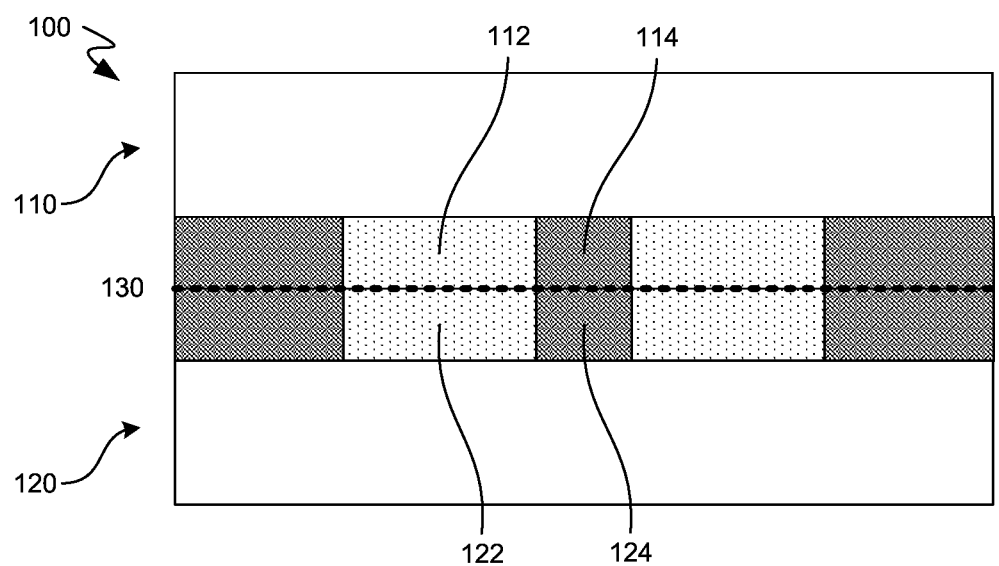

FIGS. 1A-1B are side cross-sectional views of a semiconductor assembly 100 ("assembly 100") at various stages of a hybrid bonding process. Referring to FIG. 1A, the assembly 100 includes a first semiconductor device 110 having a plurality of first metal bonding zones 112 and a plurality of first oxide bonding zones 114. The assembly 100 further includes a second semiconductor device 120 having a plurality of second metal bonding zones 122 and a plurality of second oxide bonding zones 124. The plurality of first metal bonding zones 112 can correspond to and be vertically aligned with the plurality of second metal bonding zones 122. Similarly, the plurality of first oxide bonding zones 114 can correspond to and be vertically aligned with the plurality of second oxide bonding zones 124.

Referring to FIG. 1B, the first and second semiconductor devices 110, 120 can be coupled using a hybrid bond 130. The hybrid bond 130 can be formed using any suitable technique, including techniques known to those of skill in the art. The hybrid bond 130 can couple the plurality of first metal bonding zones 112 to the plurality of second metal bonding zones 122 with a metal-metal bond. The hybrid bond 130 can additionally couple the plurality of first oxide bonding zones 114 to the plurality of second oxide bonding zones 124 with an oxide-oxide bond. In the illustrated embodiment, the metal-metal bond and oxide-oxide bond are coplanar. The hybrid bond 130, metal-metal bond, and/or oxide-oxide bond can be formed using any suitable technique, including techniques known to one of skill in the art.

Figure 2:
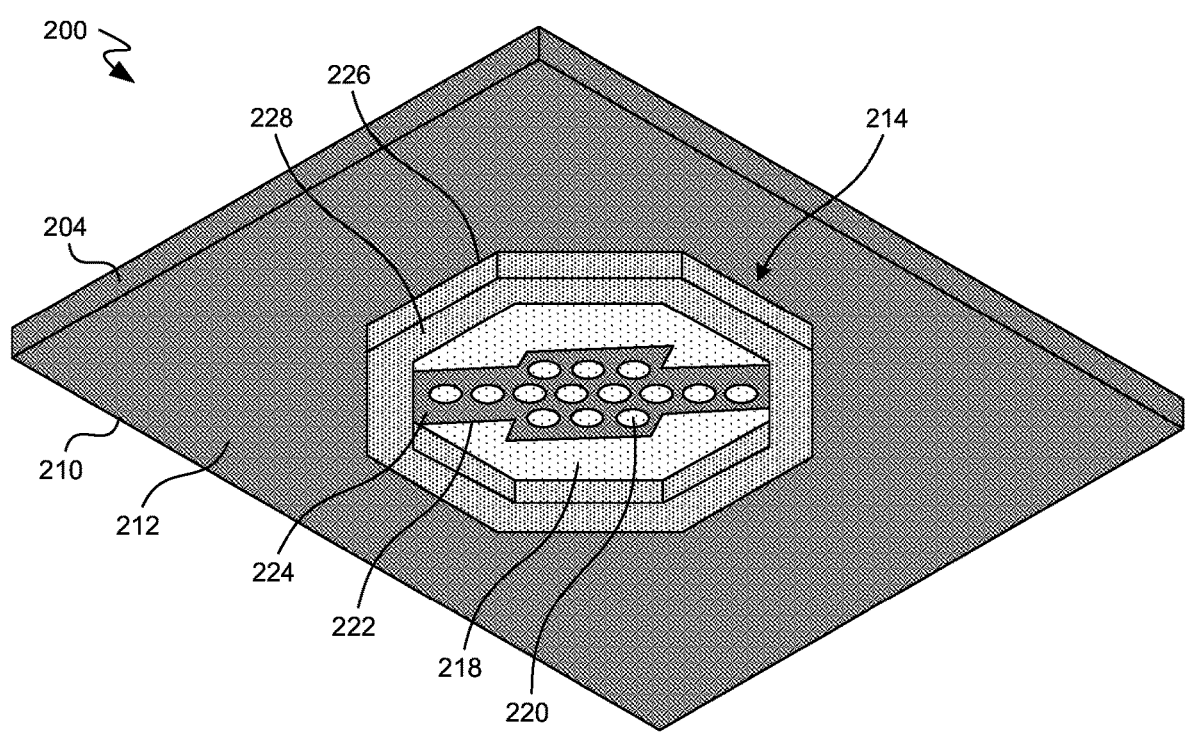
FIG. 2 is an isometric view of a semiconductor device with vertically offset bonding surfaces, configured in accordance with embodiments of the present technology.

FIG. 2 is an isometric view of a semiconductor device 200 ("device 200") with vertically offset bonding surfaces, configured in accordance with embodiments of the present technology. The device 200 can include a semiconductor substrate 204 at least partially covered by a first insulating material layer 210 having an upper surface 212. In the illustrated embodiment, the device 200 further includes an interconnect structure 214 that can be coupled to semiconductor substrate 204 and at least partially disposed in the first insulating material layer 210. The interconnect structure 214 can include a plurality of conductive elements 218 electrically coupled to the semiconductor substrate 204. Each one of the plurality of conductive elements 218 can have an end surface 220 that can be coplanar with the other end surfaces 220. The interconnect structure 214 can further include a continuous region of a second insulating material 222 at least partially between the plurality of conductive elements 218. The continuous region of the second insulating material 222 can have an uppermost surface 224 that is coplanar with the end surfaces 220 of the plurality of conductive elements 218. The interconnect structure 214 can further include a perimeter structure 226 surrounding the plurality of conductive elements 218 and the continuous region of the second insulating material 222. The perimeter structure 226 can have an uppermost surface 228 that can be vertically offset from either the coplanar end surfaces 220 of the plurality of conductive elements 218 and the uppermost surface 224 of the continuous region of the second insulating material 222, or the upper surface 212 of the first insulating material layer 210.

Although illustrated as having an octagonal shape in FIG. 2, in other embodiments the perimeter structure 226 can be circular, triangular, square, rectangular, pentagonal, hexagonal, or any other suitable shape. Although the continuous region of second insulating material 222 is illustrated as having an elongate shape in FIG. 2, in other embodiments the continuous region of second insulating material 222 can be circular, triangular, square, rectangular, pentagonal, hexagonal, or any other suitable shape. Although the plurality of conductive elements 218 are illustrated as being a mix of two shapes in FIG. 2, in other embodiments each one of the plurality of conductive elements 218 can be circular, triangular, square, rectangular, pentagonal, hexagonal, or any other suitable shape. Although the plurality of conductive elements 218 are illustrated as having a specific arrangement within the perimeter structure 226 in FIG. 2, in other embodiments the plurality of conductive elements 218 can be evenly distributed within the perimeter structure 226, clustered near an interior portion of the perimeter structure 226, clustered near a peripheral portion of the perimeter structure 226, arranged to form a pattern (e.g., linear, circular, triangular, square, etc.) within the perimeter structure 226, arranged to form a shape having linear and/or radial symmetry with respect to the perimeter structure 226, or any other suitable distribution within the perimeter structure 226. Although illustrated as having sixteen conductive elements 218 in FIG. 2, in other embodiments the device 200 can include more or fewer conductive elements 218. For example, the device 200 can include at least one, two, three, four, five, six, seven, eight, nine, ten, twenty, fifty, or one hundred conductive elements 218.

The semiconductor device 200 of FIG. 2 can have increased bonding strength compared to the devices 110, 120 of FIGS. 1A-1B. For example, the vertical offset of the uppermost surface 228 of the perimeter structure 226 can provide additional surface area available to form oxide-oxide and/or metal-metal bonds. The increased bonding surface area can increase the overall bond strength. Additionally, the vertical offset can help align at least one of the plurality of conductive elements 218, the continuous region of the second insulating material 222, the perimeter structure 226, or the first insulating material layer 210 of the device 200 with a corresponding component on another device 200 during the bonding process (best seen in FIGS. 6A-6J).

Figure 3:
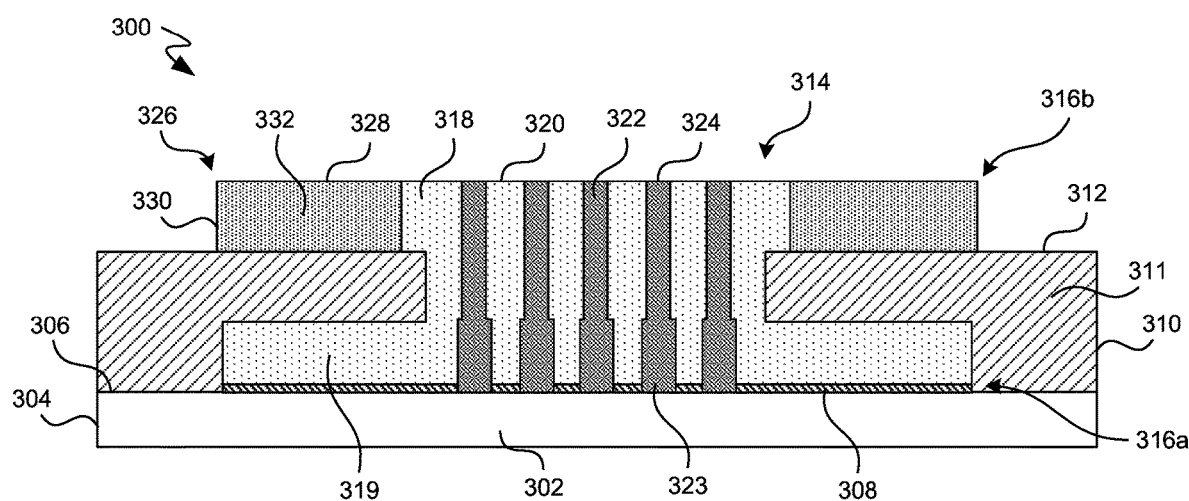
FIG. 3 is a side cross-sectional view of a semiconductor device configured in accordance with embodiments of the present technology.

FIG. 3 is a side cross-sectional view of a semiconductor device 300 ("device 300") configured in accordance with embodiments of the present technology. The device 300 can include a semiconductor die 302, including a semiconductor substrate 304 (e.g., a silicon substrate, a gallium arsenide substrate, an organic laminate substrate, etc.) having a first side or surface 306.

The first side 306 of the semiconductor substrate 304 can be an active side or region including one or more circuit elements 308 (e.g., wires, traces, interconnects, transistors, etc.) (shown schematically) formed in and/or on the first side 306. The circuit elements 308 can include, for example, memory circuits (e.g., dynamic random access memory (DRAM) or other type of memory circuits), controller circuits (e.g., DRAM controller circuits), logic circuits, and/or other circuits. In other embodiments, the semiconductor substrate 304 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

The semiconductor die 302 can further include an insulating material layer 310 formed over at least a portion of the first side 306 of the semiconductor substrate 304. The insulating material layer 310 can be a first insulating material 311, and can include one or more layers of a suitable dielectric material (e.g., a passivation material, a polyimide material, and/or other materials used to cover a surface of a semiconductor device). For example, the first insulating material 311 can comprise silicon oxide, silicon nitride, poly-silicon nitride, poly-silicon oxide, tetraethyl orthosilicate (TEOS), etc. In some embodiments, the first insulating material 311 can at least partially comprise a dielectric material with a small dielectric constant relative to silicon oxide (a "low-κ dielectric material"). Such low-κ dielectric materials can include fluorine-doped silicon dioxide, carbon-doped silicon dioxide, porous silicon dioxide, organic polymeric dielectrics, silicon-based polymeric dielectrics, etc. The first insulating material 311 can be a first oxide material selected based on bonding properties (e.g., oxide-oxide bonding, nitride-nitride bonding, etc.) known to those of skill in the art.

The insulating material layer 310 can include an upper surface 312. In the illustrated embodiment, the upper surface 312 can be vertically offset from (e.g., above, over, at least partially covering, etc.) the first side 306 of the semiconductor substrate 304. The upper surface 312 can be generally planar and/or parallel to the first side 306 of the semiconductor substrate 304.

The device 300 can further include an interconnect structure 314 disposed at least partially in the insulating material layer 310. The interconnect structure 314 can have a first end portion 316a mechanically and/or electrically coupled to the first side 306 of the semiconductor substrate 304, and a second end portion 316b opposite the first end portion 316a. In some embodiments, the device 300 can include a plurality of interconnect structures, and at least some of the interconnect structures 314 can be "dummy" structures that are not electrically coupled to semiconductor substrate 304.

The interconnect structure 314 can include a plurality of conductive elements 318 that can be mechanically and/or electrically coupled to the first side 306 of the semiconductor substrate 304. For example, at least some of the plurality of conductive elements 318 can be electrically coupled to the circuit elements 308. The interconnect structure 314 can include at least one, two, three, four, five, six, seven, eight, nine, ten, fifteen, twenty, fifty, or more conductive elements 318. Each conductive element 318 can have a generally elongate shape extending from the first end portion 316a of the interconnect structure 314 to the second end portion 316b of the interconnect structure 314. For example, the conductive elements 318 can be configured as columns, rods, posts, fibers, filaments, etc. At least some of the conductive elements 318 can be wider at the first end portion 316a of the interconnect structure 314 than at the second end portion 316b of the interconnect structure. Optionally, at least some of the conductive elements 318 can be narrower at the first end portion 316a of the interconnect structure 314 than at the second end portion 316b of the interconnect structure 314. In some embodiments, some or all of the conductive elements 318 can have a linear, polygonal, curved, curvilinear, zigzag, serpentine, or any other suitable shape. The conductive elements 318 can be made of a conductive material 319, such as copper, nickel, gold, silicon, tungsten, conductive-epoxy, combinations thereof, etc. Each one of the plurality of conductive elements 318 can have an end surface 320, and at least one of the end surfaces 320 can be coplanar with another of the end surfaces 320. In some embodiments, all end surfaces 320 of the plurality of conductive elements 318 can be coplanar.

In the illustrated embodiment, the interconnect structure 314 further includes a continuous region 322 of a second insulating material 323. The continuous region 322 can extend from the first end portion 316a of the interconnect structure 314 to the second end portion 316b of the interconnect structure 314. The continuous region 322 can be at least partially between the plurality of conductive elements 318. For example, the continuous region 322 can fill the lateral spaces between the conductive elements 318 such that the interconnect structure 314 has a solid cross-section with few or no interior voids or gaps. The continuous region 322 can further include an uppermost surface 324 that can be coplanar with at least one of the end surfaces 320 of the plurality of conductive elements 318. In some embodiments, the uppermost surface 324 of the continuous region 322 can be coplanar with all end surfaces 320 of the plurality of conductive elements 318, such that the end surfaces 320 and uppermost surface 324 can form a plane that is parallel to and/or vertically offset from the upper surface 312 of the first insulating material layer 310.

The second insulating material 323 (e.g., forming the continuous region 322) can be a same or different material than the first insulating material 311, and can be formed from any of the materials discussed previously regarding the first insulating material 311. For example, the second insulating material 323 can comprise silicon oxide, silicon nitride, poly-silicon nitride, poly-silicon oxide, TEOS, etc. In some embodiments, the second insulating material 323 can be selected based on desired bonding (e.g., oxide-oxide bonding, nitride-nitride bonding, etc.) properties known to those of skill in the art.

In the illustrated embodiment, the interconnect structure 314 further includes a perimeter structure 326 at least partially surrounding the plurality of conductive elements 318 and the continuous region 322 of the second insulating material 323. The perimeter structure 326 can be formed on the upper surface 312 of the insulating material layer 310 such that the perimeter structure 326 can at least partially cover the upper surface 312 of the insulating material layer 310. The perimeter structure 326 can further include an uppermost surface 328 that can be vertically offset from the upper surface 312 of the insulating material layer 310. In some embodiments, the uppermost surface 328 of the perimeter structure 326 can be vertically offset from the plane comprising the coplanar end surfaces 320 of the plurality of conductive elements 318 and the uppermost surface 324 of the continuous region 322 of the second insulating material 323.

The perimeter structure 326 can further include a lateral surface 330 positioned between the uppermost surface 328 of the perimeter structure 326 and the upper surface 312 of the insulating material layer 310. In some embodiments, the lateral surface 330 can define an outer periphery of the perimeter structure 326. The lateral surface 330 can be at a first angle relative to the uppermost surface 328, and at a second angle relative to the upper surface 312. For example, in the illustrated embodiment the first and second angles are right angles such that the lateral surface 330 is perpendicular to the uppermost surface 328 and the upper surface 312. However, in other embodiments the first and second angles can be any suitable angle such that the lateral surface 330 can form a taper of the perimeter structure 326 extending from the upper surface 312 towards the uppermost surface 328. A perimeter structure 326 including a lateral surface 330 having a taper can advantageously facilitate mechanical self-alignment of the interconnect structure 314.

The perimeter structure 326 can be formed from a third insulating material 332. The third insulating material 332 can be any of the materials discussed previously regarding the first insulating material 311. For example, the third insulating material 332 can comprise silicon oxide, silicon nitride, poly-silicon nitride, poly-silicon oxide, TEOS, etc. In some embodiments, the third insulating material 332 can be selected based on desired bonding (e.g., oxide-oxide bonding, nitride-nitride bonding, etc.) properties known to those of skill in the art. The third insulating material 332 can be a same or different material than the first insulating material 311 and/or the second insulating material 323. For example, the third insulating material 332 can be different from both the first insulating material 311 and the second insulating material 323.

A semiconductor device 300 configured in accordance with embodiments of the present technology can exhibit advantageous bonding behavior. For example, a bond involving the device 300 that includes the uppermost surface 328 (e.g., bonded to a corresponding surface of a second perimeter structure) and the lateral surface 330 (e.g., bonded to a corresponding lateral surface of a second perimeter structure) of the perimeter structure 326 can have an increased surface area compared to a bond involving the devices 110, 120 of FIGS. 1A-1B. In some embodiments, the end surfaces 320 of the plurality of conductive elements 318 and at least one of: (i) the upper surface 312 of the first insulating material layer 310, (ii) the uppermost surface 324 of the continuous region 322, (iii) the uppermost surface 328 of the perimeter structure 326, and (iv) the lateral surface 330 of the perimeter structure 326 can be used to directly bond the semiconductor device 300 to another device, package, assembly, or any other suitable substrate (best seen in FIGS. 6A-6J). Any combination of the above-listed bonding surfaces (i)-(iv) can advantageously increase the surface area available for bonding.

Additionally, the above-listed bonding surfaces (i)-(iv) can comprise different materials (e.g., as discussed previously). Using multiple materials to form a bond can also advantageously increase the bond strength. Furthermore, the interconnect structure 314 can correspond to another interconnect structure (best seen in FIGS. 6A-6J). Using corresponding interconnect structures can provide an additional mechanical coupling aspect (e.g., plug and socket, male-female, etc.) to the bond, which can advantageously increase bond strength and reduce the difficulty of aligning corresponding components during a bonding (e.g., hybrid bonding) process.

The device 300 can include other components typically found in semiconductor devices and known to one of skill in the art. For example, the device 300 can further include an underfill or molded material (not shown) formed over and/or at least partially around the semiconductor die 302. In some embodiments, the device 300 includes other components such as external heatsinks, a casing (e.g., thermally conductive casing), electromagnetic interference (EMI) shielding components, etc.

FIGS. 4A-4G are side cross-sectional views of semiconductor devices 400 ("devices 400") configured in accordance with embodiments of the present technology. The components of the devices 400 in FIGS. 4A-4G can be generally similar to the components of the device 300 of FIG. 3. Accordingly, like numbers (e.g., interconnect structures 414a-g versus interconnect structure 314) are used to identify similar or identical components, and the discussion of the devices 400a-g of FIGS. 4A-4G will be limited to those features that differ from the device 300 of FIG. 3. Additionally, any features of the devices 400a-g of FIGS. 4A-4G can be combined with each other and/or with the device 300 of FIG. 3.

Figure 4A:
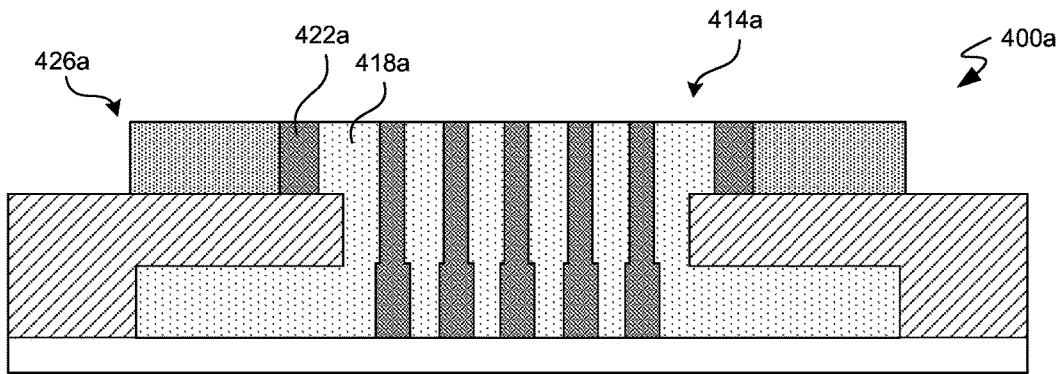
FIGS. 4A-4G are side cross-sectional views of semiconductor devices configured in accordance with embodiments of the present technology.

FIG. 4A illustrates a semiconductor device 400a that is generally similar to the device 300 of FIG. 3. However, the semiconductor device 400a of FIG. 4A can further include an interconnect structure 414a where the continuous region 422a is at least partially between the plurality of conductive elements 418a and the perimeter structure 426a.

Figure 4B:
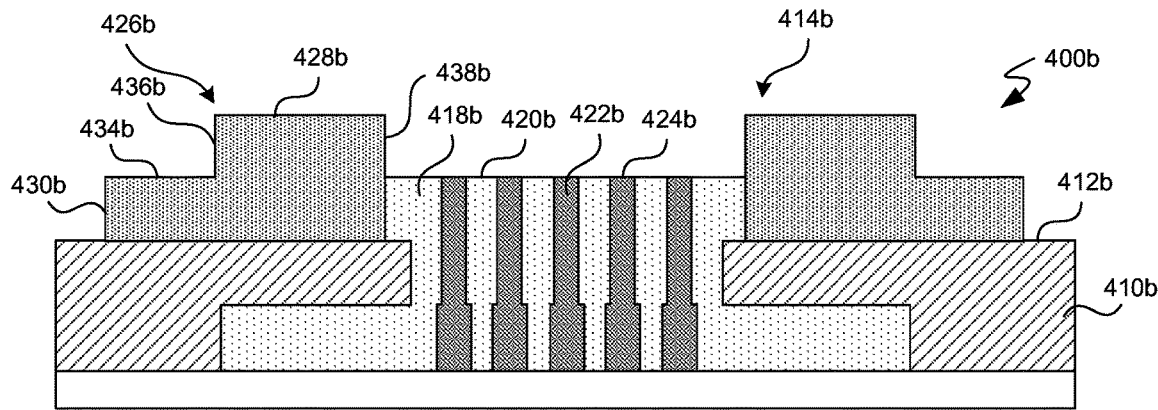

FIG. 4B illustrates a semiconductor device 400b having an interconnect structure 414b including a perimeter structure 426b, where the perimeter structure 426b includes an intermediate surface 434b. The intermediate surface 434b can be parallel to an uppermost surface 428b of the perimeter structure 426b and can be vertically offset from the uppermost surface 428b and/or an upper surface 412b of a first insulating material layer 410b.

The perimeter structure 426b can further include a second lateral surface 436b positioned between the intermediate surface 434b and the uppermost surface 428b. The second lateral surface 436b can be at a first angle relative to the intermediate surface 434b, and at a second angle relative to the uppermost surface 428b. For example, the second lateral surface 436b can be perpendicular to the intermediate surface 434b and the uppermost surface 428b. The second lateral surface 436b can be horizontally (e.g., laterally, in an inward or outward direction) offset from the first lateral surface 430b. For example, as best illustrated by FIG. 4B, the second lateral surface 436b can be inwardly offset relative to the first lateral surface 430b. In other embodiments, the second lateral surface 436b can be outwardly offset relative to the first lateral surface 430b.

The perimeter structure 426b can further include a third lateral surface 438b positioned between the uppermost surface 428b of the perimeter structure 426b and the coplanar end surfaces 420b of the plurality of conductive elements 418b and the uppermost surface 424b of the continuous region 422b. The third lateral surface 438b can be at a first angle relative to uppermost surface 428b, and at a second angle relative to the coplanar end surfaces 420b of the plurality of conductive elements 418b and the uppermost surface 424b of the continuous region 422b. For example, the second lateral surface 436b can be perpendicular to both the uppermost surface 428b of the perimeter structure 426c and the coplanar end surfaces 420b of the plurality of conductive elements 418b and/or the uppermost surface 424b of the continuous region 422b. The third lateral surface 438b can be parallel to and/or horizontally (e.g., laterally, in an inward or outward direction) offset from the first lateral surface 430b and/or the second lateral surface 436b. For example, as best illustrated by FIG. 4B, the third lateral surface 438b can be inwardly offset relative to the first lateral surface 430b and the second lateral surface 436b.

Figure 4C:
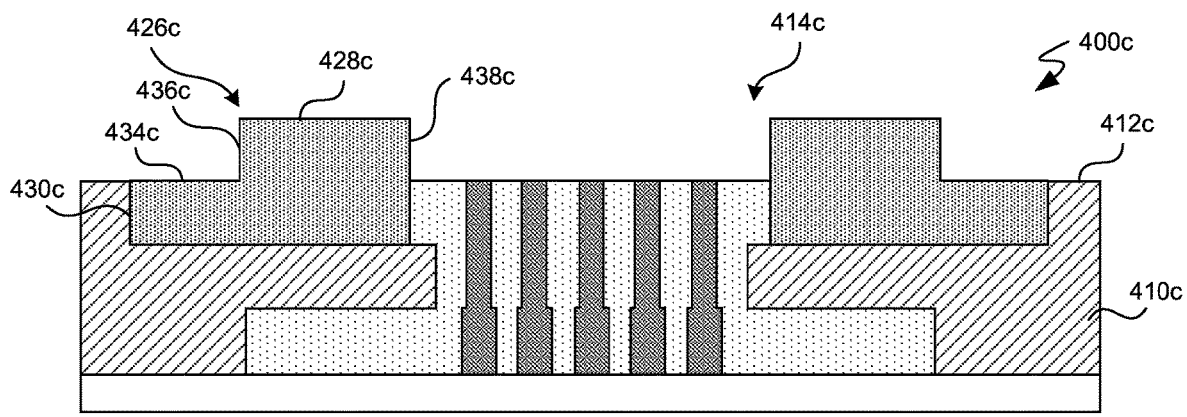

FIG. 4C illustrates a semiconductor device 400c that is generally similar to semiconductor device 400b of FIG. 4B. However, the semiconductor device 400c of FIG. 4C can further include a first insulating material layer 410c at least partially covering the first lateral surface 430c. For example, the uppermost surface 412c of the first insulating material layer 410c can be coplanar with the intermediate surface 434c of the perimeter structure 426c.

Figure 4D:
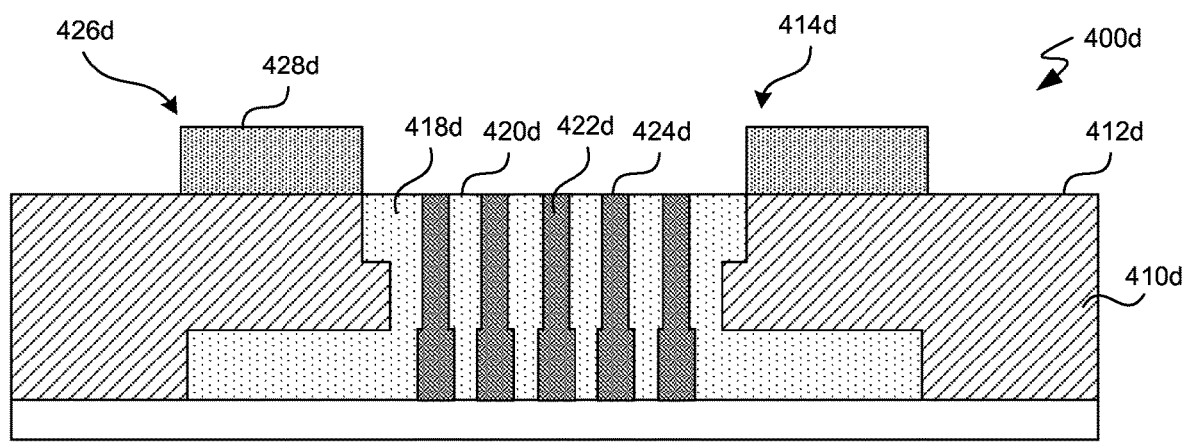

FIG. 4D illustrates a semiconductor device 400d where the end surfaces 420d of the plurality of conductive elements 418d and uppermost surface 424d of the continuous region 422d are coplanar with the uppermost surface 412d of the first insulating material layer 410d. In the illustrated embodiment, the uppermost surface 428d of the perimeter structure 426d can be vertically offset from both the uppermost surface 412d of the first insulating material layer 410d and the end surfaces 420d of the plurality of conductive elements 418d and uppermost surface 424d of the continuous region 422d.

Figure 4E:
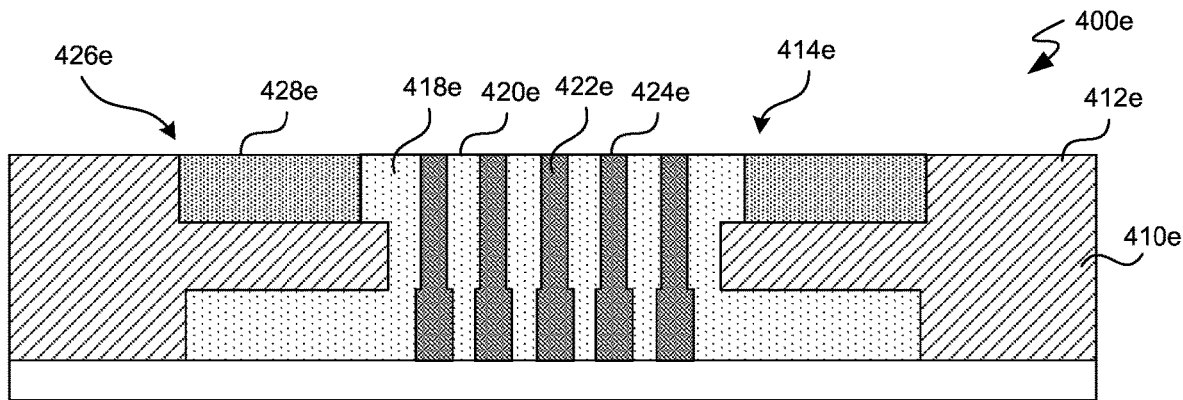

FIG. 4E illustrates a semiconductor device 400e where the end surfaces 420e of the plurality of conductive elements 418e, the uppermost surface 424e of the continuous region 422e, and the uppermost surface 428e of the perimeter structure 426e are coplanar with the upper surface 412e of the first insulating material layer 410e.

Figure 4F:
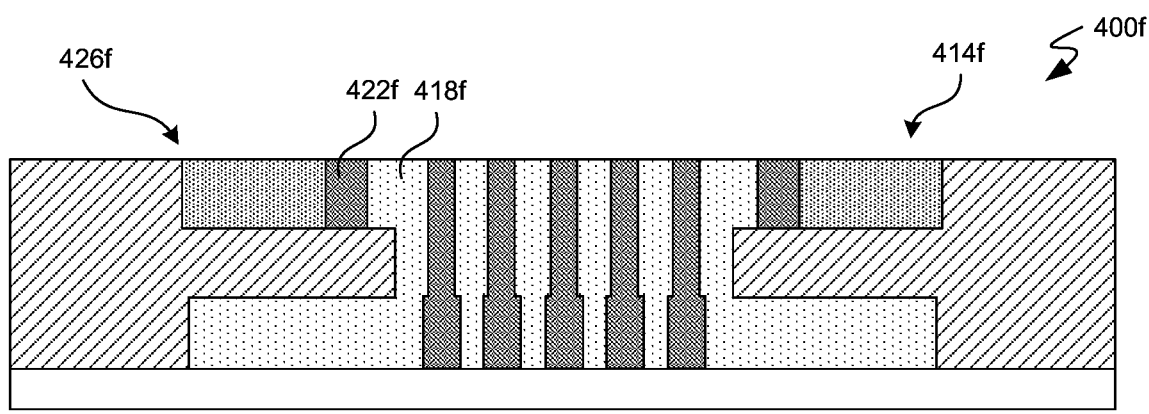

FIG. 4F illustrates a semiconductor device 400f that is generally similar to the semiconductor device 400e of FIG. 4E. However, the device 400f of FIG. 4F can further include an interconnect structure 414f where the continuous region 422f is at least partially between the plurality of conductive elements 418f and the perimeter structure 426f.

Figure 4G:
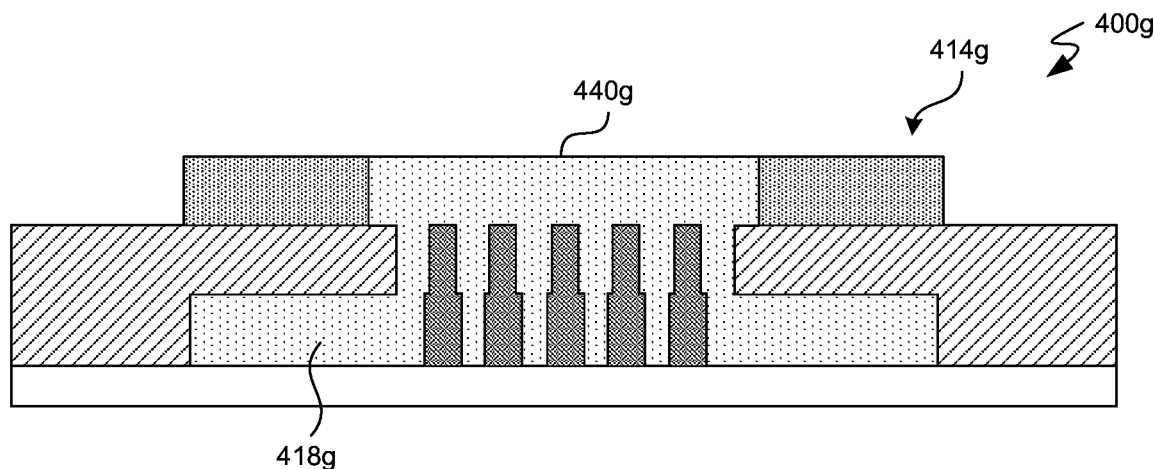

FIG. 4G illustrates a semiconductor device 400g that is generally similar to the semiconductor device 300 of FIG. 3. However, the semiconductor device 400g of FIG. 4G can further include a plurality of conductive elements 418g wherein at least some of the plurality of conductive elements 418g are electrically coupled to form a single electrical connector 440g.

Figure 5:
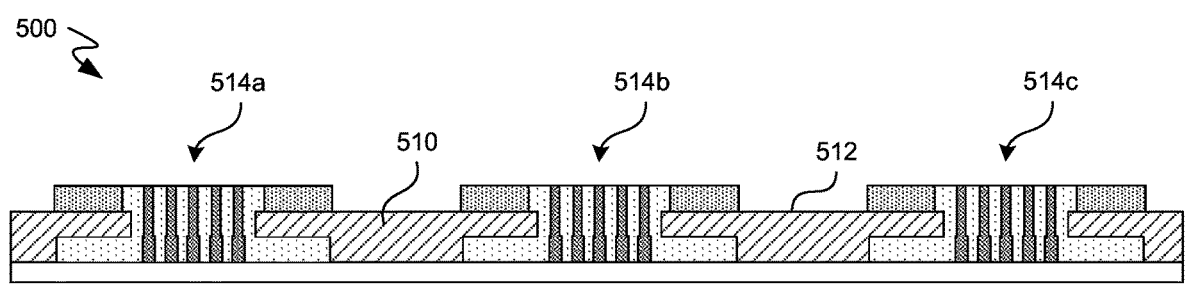
FIG. 5 is a side cross-sectional view of a semiconductor device configured in accordance with embodiments of the present technology.

FIG. 5 illustrates a semiconductor device 500 having a plurality of interconnect structures 514a-c, configured in accordance with embodiments of the present technology. The semiconductor device 500, interconnect structures 514a-c, and any components thereof can be generally similar to the device 300 and interconnect structure 314 of FIG. 3, and/or the devices 400a-g and interconnect structures 414a-g of FIGS. 4A-4G. Accordingly, like numbers (e.g., device 500 versus device 300 and devices 400a-g) are used to identify similar or identical components, and discussion of the device 500 will be limited to those features that differ from the device 300 of FIG. 3 and/or the devices 400a-g of FIGS. 4A-4G. Additionally, any of the features of the device 500 of FIG. 5 can be combined with the device 300 of FIG. 3 and/or the devices 400a-g of FIGS. 4A-4G.

Referring to FIG. 5, the interconnect structures 514a-c (referred to collectively as "interconnect structures 514") can be spaced apart, and a first insulating material layer 510 can be at least partially between the interconnect structures 514. Although FIG. 5 illustrates each of the interconnect structures 514a-c as having the same configuration (e.g., like the device 300 of FIG. 3), in other embodiments some or all of the interconnect structures 514 can have different configurations. For example, the device 500 can include one or more of the interconnect structures 414a-g disclosed in FIGS. 4A-4G. Additionally, the device 500 can include more or fewer interconnect structures 514 than illustrated in FIG. 5. For example, the device 500 can include at least two, four, five, six, seven, eight, nine, ten, fifteen, twenty, fifty, or more interconnect structures 514.

FIGS. 6A-6J are side cross-sectional views of first and second semiconductor devices 600a-j and 650a-j, and respective first and second interconnect structures 614a-j, 664a-j, configured in accordance with embodiments of the present technology. The first devices 600a-j can be positioned over the second devices 650a-j to vertically align the first interconnect structures 614a-j with the second interconnect structures 664a-j. The second devices 650a-j and the second interconnect structures 664a-j can be configured to correspond to the first devices 600a-j and the first interconnect structures 614a-j, such that the second interconnect structures 664a-j can receive the first interconnect structures 614a-j to couple the second devices 650a-j to the first devices 600a-j. Accordingly, the first devices 600a-j and/or the first interconnect structures 614a-j can be directly bonded to the second devices 650a-j and/or the second interconnect structures 664a-j.

The components of the devices 600a-j, 650a-j in FIGS. 6A-6J can be generally similar to the components of the device 300 of FIG. 3. Additionally, each of the devices 600a-j, 650a-j can be configured so as to be generally similar to the devices 400a-g of FIGS. 4A-4G. Accordingly, like numbers (e.g., first perimeter structures 626a-j and second perimeter structures 676a-j of FIGS. 6A-6J versus perimeter structure 326 of FIG. 3 and perimeter structures 426a-g of FIGS. 4A-4G) are used to identify similar or identical components. Discussion of the devices 600a-j, 650a-j of FIGS. 6A-6J will be limited to those features that differ from the device 300 of FIG. 3 and/or the devices 400a-g of FIGS. 4A-4G. Additionally, any features of the devices 600a-j, 650a-j of FIGS. 6A-6J can be combined with each other, with the device 500 of FIG. 5, with the devices 400a-g of FIGS. 4A-4G, and/or with the device 300 of FIG. 3.

Figure 6A:
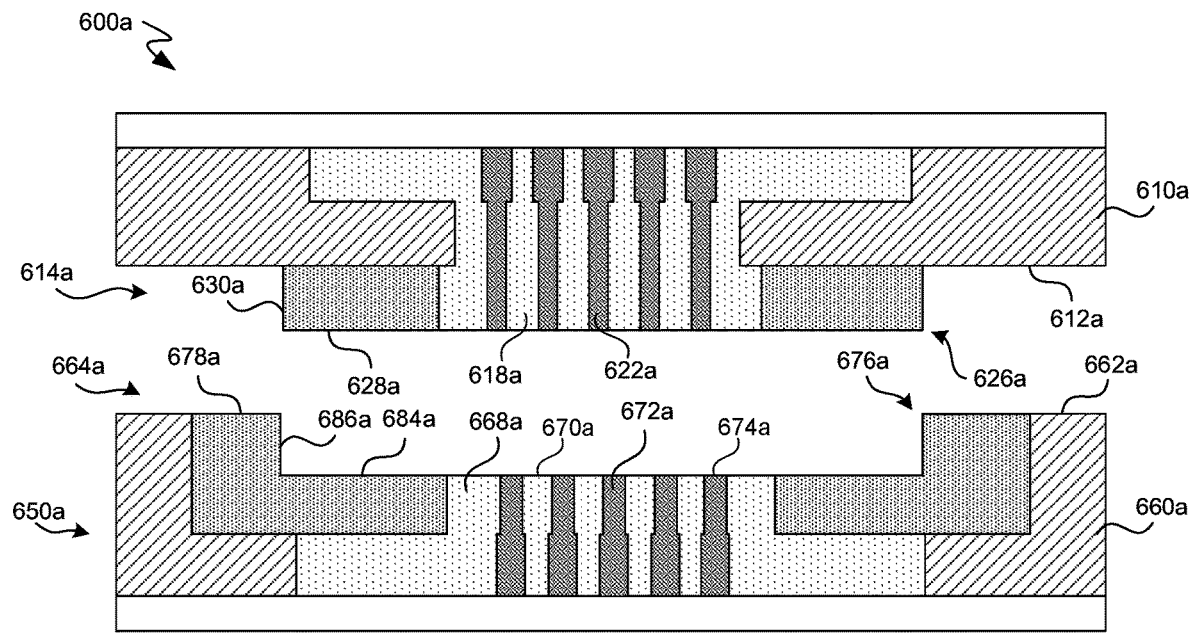
FIGS. 6A-6J are side cross-sectional views of first and second semiconductor devices having corresponding interconnect structures, configured in accordance with embodiments of the present technology.

FIG. 6A illustrates a first device 600a that is generally similar to the device 300 of FIG. 3, and a second device 650a that can correspond to the first device 600a. For example, the second device 650a can include a second perimeter structure 676a formed at least partially over the second plurality of conductive elements 668a. The second perimeter structure 676a can include an uppermost surface 678a, an intermediate surface 684a parallel to and/or vertically offset from the uppermost surface 678a, and a second lateral surface 686a between the uppermost surface 678a and the intermediate surface 684a. In the illustrated embodiment, the intermediate surface 684a is coplanar with the second end surfaces 670a of the second plurality of conductive elements 668a and the uppermost surface 674a of the second continuous region 672a.

The first device 600a can be directly bonded to the second device 650a. During bonding, at least one of the following combinations of components can be vertically aligned and/or at least partially coupled: (i) each one of the first plurality of conductive elements 618a with a corresponding one of the second plurality of conductive elements 668a; (ii) the first continuous region 622a with the second continuous region 672a; (iii) the lowermost surface 628a of the first perimeter structure 626a with the intermediate surface 684a of the second perimeter structure 676a; (iv) the first lateral surface 630a of the first perimeter structure 626a with the second lateral surface 686a of the second perimeter structure 676a; (v) at least a first portion of the lower surface 612a of the first insulating material layer 610a with the uppermost surface 678a of the second perimeter structure 676a; and (vi) at least a second portion of the lower surface 612a of the first insulating material layer 610a with the uppermost surface 662a of the second insulating material layer 660a.

The above-mentioned bonds can occur in different planes. For example, the first plurality of conductive elements 618a can be directly bonded to the second plurality of conductive elements 668a in a first plane, at least a first portion of the lower surface 612a of the first insulating material layer 610a can be directly bonded to the uppermost surface 678a of the second perimeter structure 676a in a second plane, and the first plane can be vertically offset from the second plane.

Figure 6B:
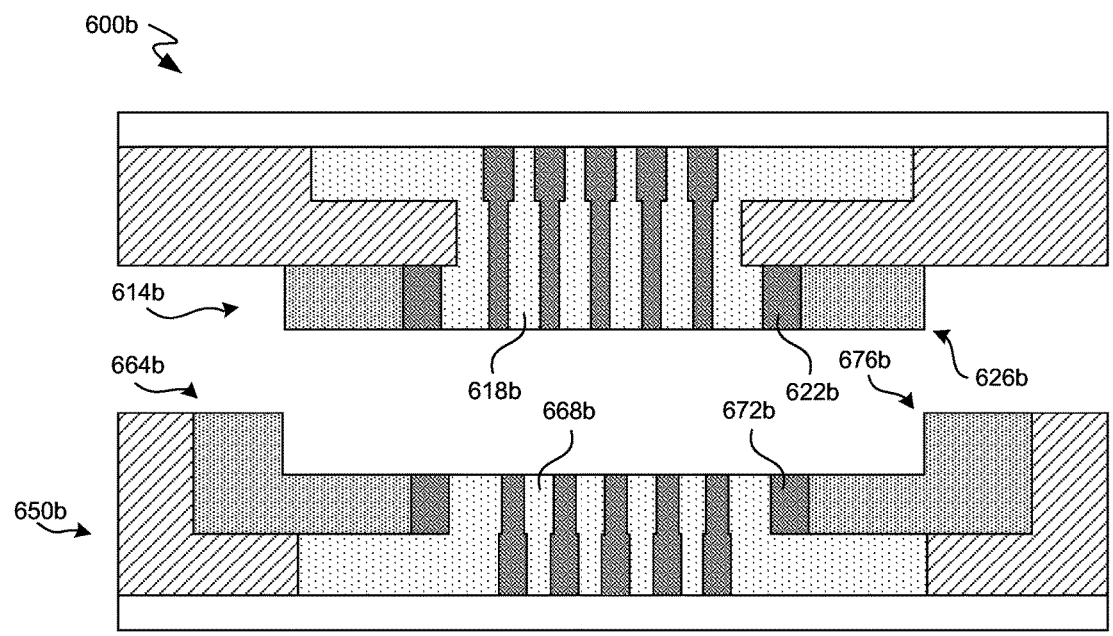

FIG. 6B illustrates a first semiconductor device 600b configured similarly to the semiconductor device 400a of FIG. 4A, and a second device 650b that can be configured to correspond to the first device 600b. For example, the second device 650b can include an interconnect structure 664b having a second continuous region 672b that can be at least partially between the second plurality of conductive elements 668b and the second perimeter structure 676b.

The first device 600b can be directly bonded to the second device 650b, as discussed previously. During bonding, the list of elements that can be vertically aligned and/or at least partially coupled discussed with respect to FIG. 6A can apply equally to FIG. 6B. Additionally, the portion of the first continuous region 622b at least partially between the first plurality of conductive elements 618b and the first perimeter structure 626b can be vertically aligned with and/or coupled to the corresponding portion of the second continuous region 672b at least partially between the second plurality of conductive elements 668b and the second perimeter structure 676b.

Figure 6C:
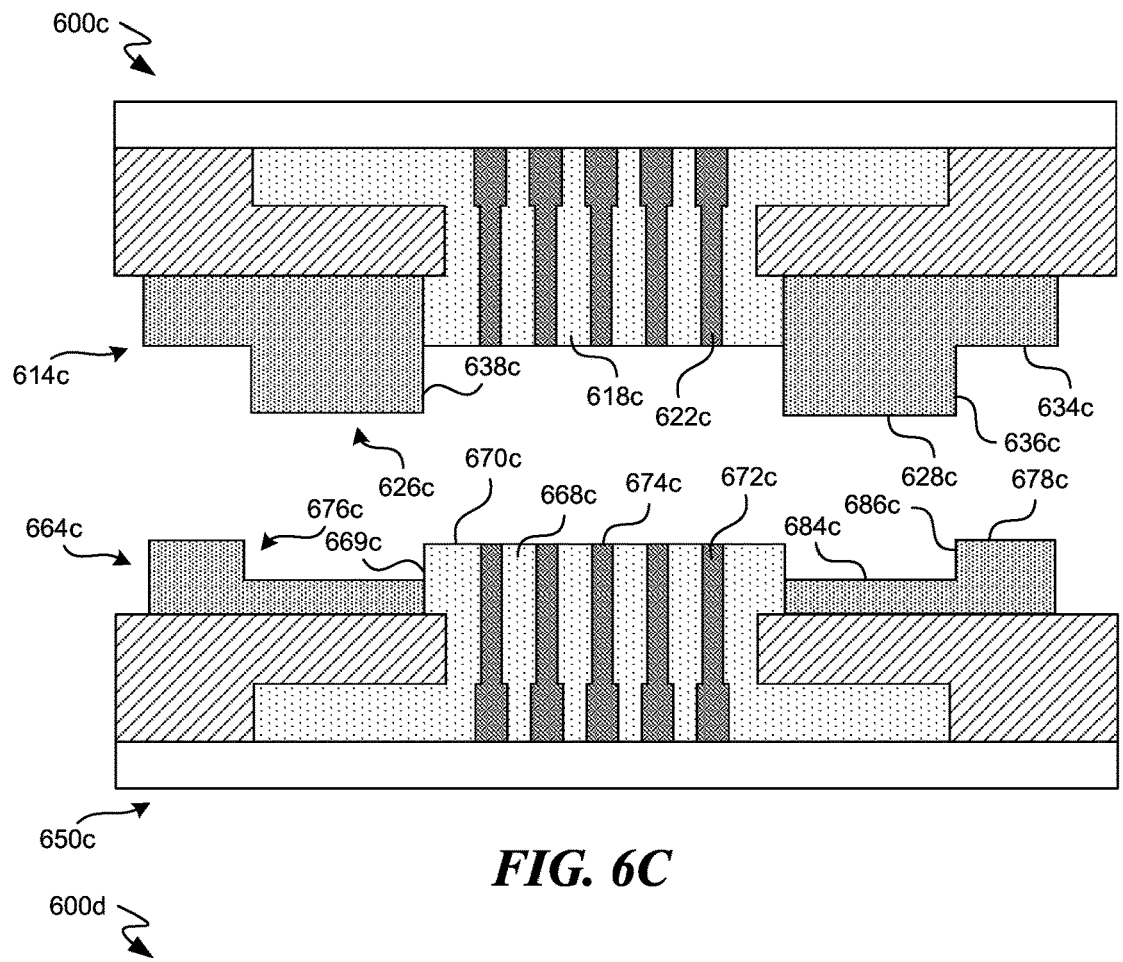

FIG. 6C illustrates a first semiconductor device 600c configured similarly to the device 400b of FIG. 4B, and a second device 650c that can be configured to correspond to the first device 600c. For example, the second device 650c can include a second perimeter structure 676c having an uppermost surface 678c. The uppermost surface 678c can be coplanar with the second end surfaces 670c of the second plurality of conductive elements 668c and the uppermost surface 674c of the second continuous region 672c. In the illustrated embodiment, the second perimeter structure 676c can further include a second intermediate surface 684c that can be parallel to and/or vertically offset from the uppermost surface 678c. The second perimeter structure 676c can further include a second lateral surface 686c between the uppermost surface 678c and the second intermediate surface 684c. The second lateral surface 686c can be parallel to a side 669c of the second plurality of conductive elements 668c. The side 669c can be at least partially exposed such that it can correspond to a third lateral surface 638c of the first perimeter structure 626c. In some embodiments, the side 669c can be configured as a plug and the third lateral surface 638c can be configured as a corresponding socket; this configuration can advantageously improve the alignment, mechanical coupling, and/or bonding of the first and second devices 600c, 650c.

The first device 600c can be directly bonded to the second device 650c, as discussed previously. During bonding, at least one of the following combination features can be vertically aligned and/or at least partially coupled: (i) each of the first plurality of conductive elements 618c with a corresponding one of the second plurality of conductive elements 668c; (ii) the first continuous region 622c with the second continuous region 672c; (iii) the lowermost surface 628c of the first perimeter structure 626c with the second intermediate surface 684c of the second perimeter structure 676c; (iv) the first lateral surface 636c of the first perimeter structure 626c with the second lateral surface 686c of the second perimeter structure 676c; (v) the first intermediate surface 634c of the first perimeter structure 626c with the uppermost surface 678c of the second perimeter structure 676c; and (vi) at least a portion of the side 669c of the second plurality of conductive elements 668c with at least a portion of the third lateral surface 638c of the first perimeter structure 626c.

The above-mentioned bonds can occur in different planes. For example, the first plurality of conductive elements 618c can be directly bonded to the second plurality of conductive elements 668c in a first plane, the lowermost surface 628c of the first perimeter structure 626c can be directly bonded to the second intermediate surface 684c of the second perimeter structure 676c in a second plane, and the first plane can be vertically offset from the second plane.

Figure 6D:
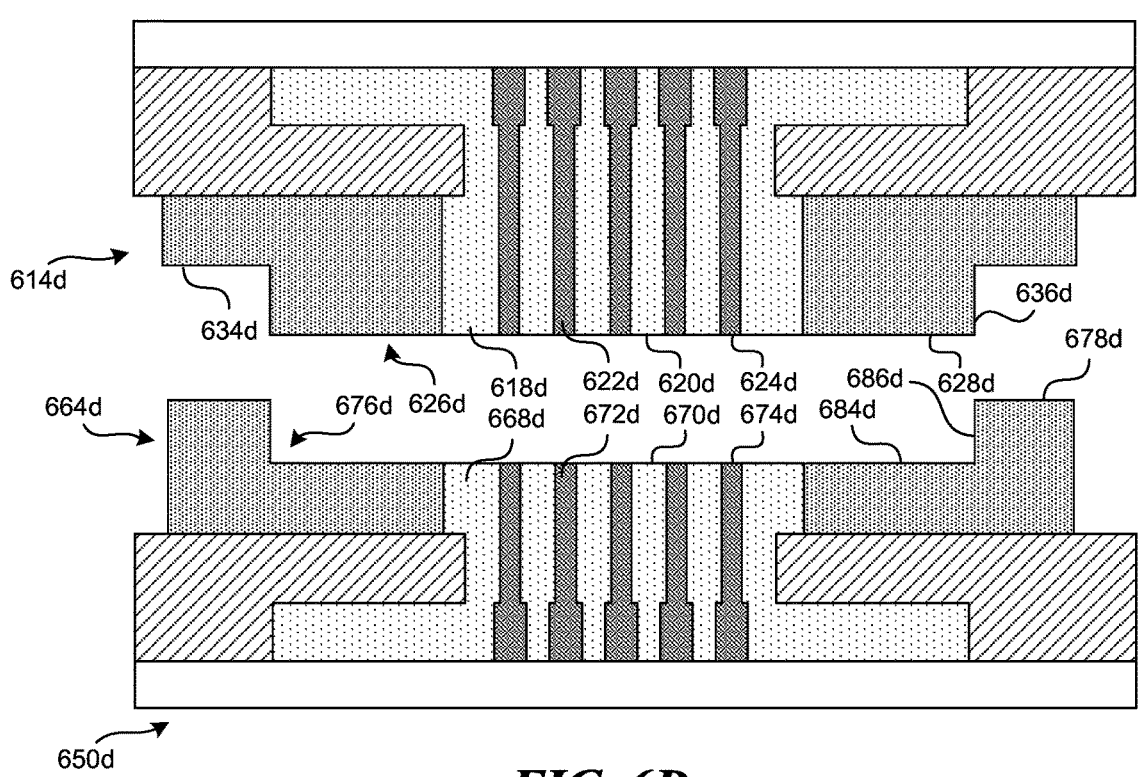

FIG. 6D illustrates a first semiconductor device 600d including a first interconnect structure 614d that can include a first perimeter structure 626d. The first perimeter structure 626d can include a lowermost surface 628d that can be coplanar with end surfaces 620d of a first plurality of conductive elements 618d and a lowermost surface 624d of a first continuous region 622d. The first perimeter structure 626d can further include a first intermediate surface 634d that can be parallel to and/or vertically offset from the lowermost surface 628d. The first perimeter structure 626d can further include a first lateral surface 636d between the first intermediate surface 634d and the lowermost surface 628d.

In the illustrated embodiment, a second semiconductor device 650d can be configured to correspond to the first semiconductor device 600d. For example, the second semiconductor device 650d can include a second interconnect structure 664d having a second perimeter structure 676d. The second perimeter structure 676d can include an uppermost surface 678d that can be vertically offset from coplanar end surfaces 670d of a second plurality of conductive elements 668d and an uppermost surface 674d of a second continuous region 672d. The second perimeter structure 676d can further include a second intermediate surface 684d that can be parallel to and/or vertically offset from the uppermost surface 678d. In the illustrated embodiment, the second intermediate surface 684d can be coplanar with the end surfaces 670d of the second plurality of conductive elements 668d and the uppermost surface 674d of the second continuous region 672d. The second perimeter structure 676d can further include a second lateral surface 686d between the second intermediate surface 684d and the uppermost surface 678d.

The first device 600d can be directly bonded to the second device 650d. During bonding, at least one of the following combination features can be vertically aligned and/or at least partially coupled: (i) each of the first plurality of conductive elements 618d with a corresponding one of the second plurality of conductive elements 668d; (ii) the first continuous region 622d with the second continuous region 672d; (iii) the lowermost surface 628d of the first perimeter structure 626d with the second intermediate surface 684d of the second perimeter structure 676d; (iv) the first lateral surface 636d of the first perimeter structure 626d with the second lateral surface 686d of the second perimeter structure 676d; and (v) the first intermediate surface 634d of the first perimeter structure 626d with the uppermost surface 678d of the second perimeter structure 676d.

The above-mentioned bonds can occur in different planes. For example, the first plurality of conductive elements 618d can be directly bonded to the second plurality of conductive elements 668d in a first plane, the first intermediate surface 634d of the first perimeter structure 626d can be directly bonded to the uppermost surface 678d of the second perimeter structure 676d in a second plane, and the first plane can be vertically offset from the second plane.

Figure 6E:
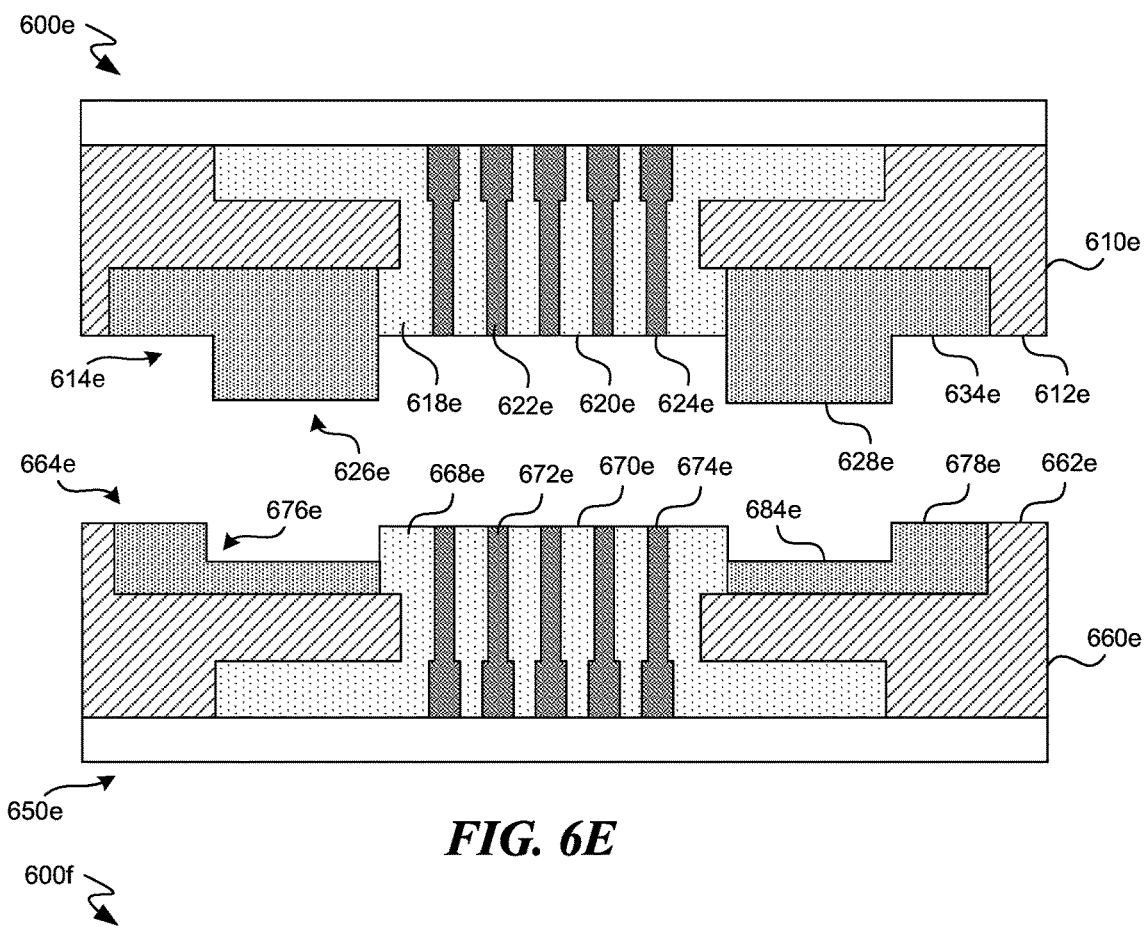

FIG. 6E illustrates first and second semiconductor devices 600e, 650e configured similarly to the respective first and second semiconductor devices 600c, 650c of FIG. 6C. However, the first device 600e can further include a first insulating material layer 610e having a lower surface 612e that is coplanar with the first intermediate surface 634e of the first perimeter structure 626e, the end surfaces 620e of a first plurality of conductive elements 618e, and the lowermost surface 624e of the first continuous region 622e. The second device 650e can further include a second insulating material layer 660e having an uppermost surface 662e that can be coplanar with the uppermost surface 678e of the second perimeter structure 676e, the end surfaces 670e of the second plurality of conductive elements 668e, and the uppermost surface 674e of the second continuous region 672e.

The first device 600e can be directly bonded to the second device 650e. During bonding, the list of elements that can be vertically aligned and/or at least partially coupled discussed with respect to FIG. 6C can apply equally to FIG. 6E. Additionally, the lower surface 612e of the first insulating material layer 610e can be vertically aligned with and/or coupled to the corresponding uppermost surface 662e of the second insulating material layer 660e.

The above-mentioned bonds can occur in different planes. For example, the first plurality of conductive elements 618e can be directly bonded to the second plurality of conductive elements 668e in a first plane, the lowermost surface 628e of the first perimeter structure 626e can be directly bonded to the second intermediate surface 684e of the second perimeter structure 676e in a second plane, and the first plane can be vertically offset from the second plane.

Figure 6F:
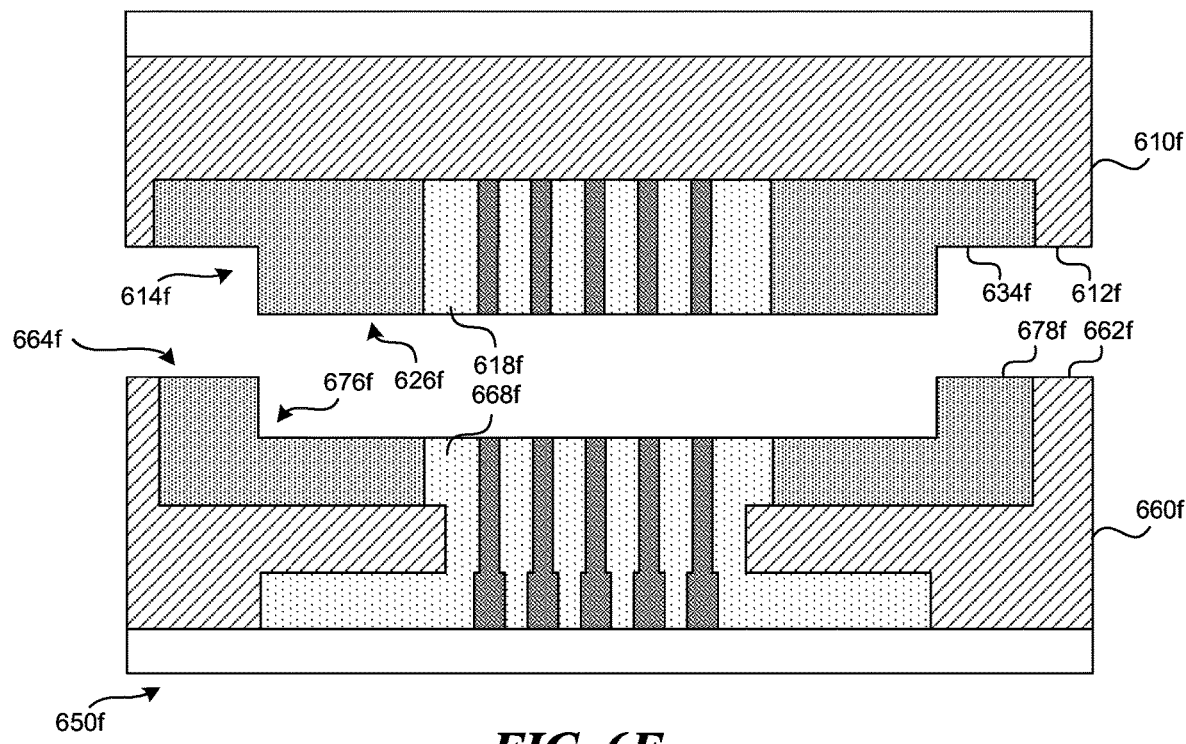

FIG. 6F illustrates first and second semiconductor devices 600f, 650f configured similarly to the respective first and second semiconductor devices 600d, 650d of FIG. 6D. However, the first device 600f can further include a first insulating material layer 610f having a lower surface 612f that can be coplanar with the first intermediate surface 634f of the first perimeter structure 626f. The second device 650f can further include a second insulating material layer 660f having an uppermost surface 662f that can be coplanar with the uppermost surface 678f of the second perimeter structure 676f.

The first device 600f can be directly bonded to the second device 650f. During bonding, the list of elements that can be vertically aligned and/or at least partially coupled discussed with respect to FIG. 6D can apply equally to FIG. 6F. Additionally, the lower surface 612f of the first insulating material layer 610f can be vertically aligned with and/or coupled to the corresponding uppermost surface 662f of the second insulating material layer 660f.

The above-mentioned bonds can occur in different planes. For example, the first plurality of conductive elements 618f can be directly bonded to the second plurality of conductive elements 668f in a first plane, the first intermediate surface 634f of the first perimeter structure 626f can be directly bonded to the uppermost surface 678f of the second perimeter structure 676f in a second plane, and the first plane can be vertically offset from the second plane.

Figure 6G:
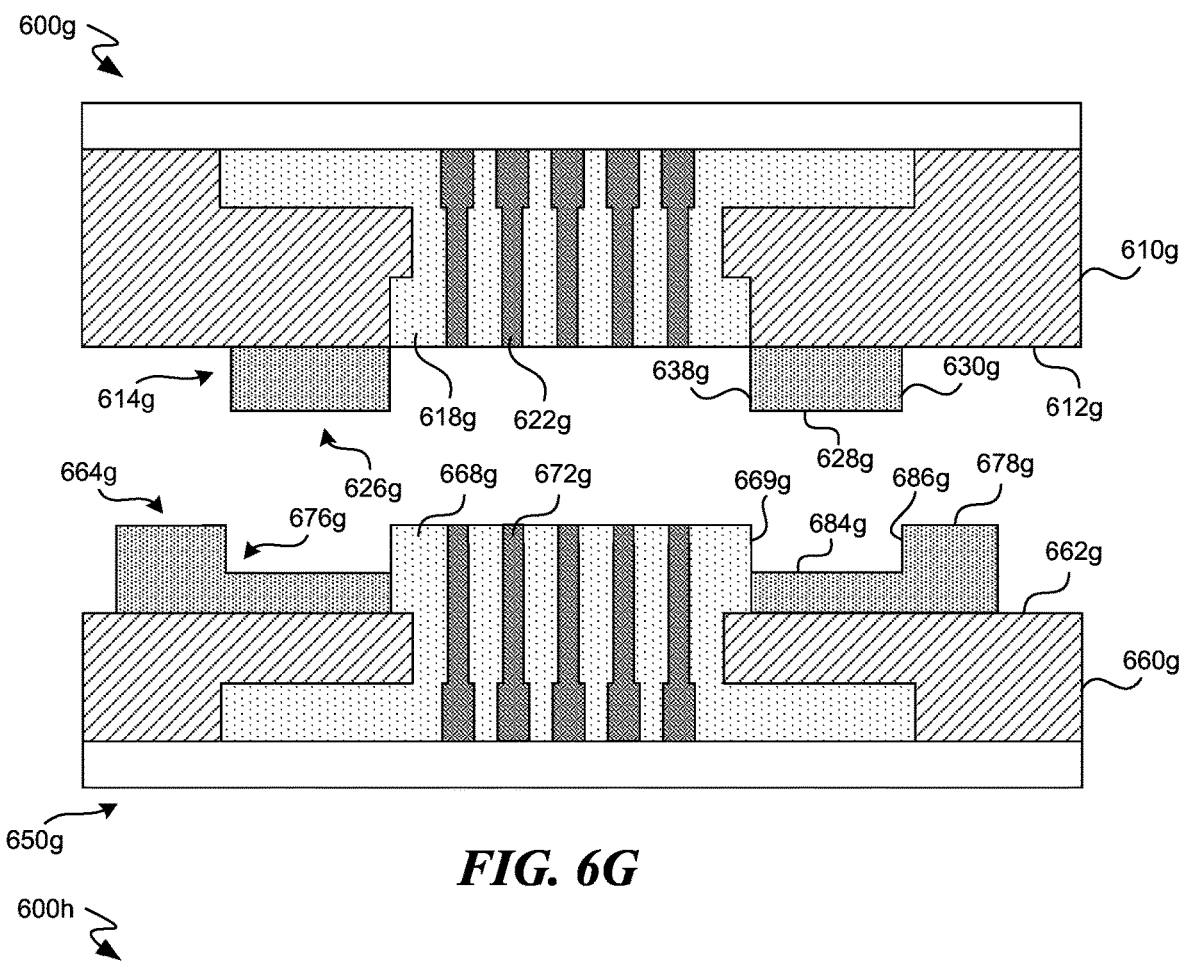

FIG. 6G illustrates a first semiconductor device 600g that can be configured similarly to the semiconductor device 400d of FIG. 4D, and a second semiconductor device 650g that can be configured similarly to the second semiconductor device 650c of FIG. 6C to correspond to the first device 600g.

The first device 600g can be directly bonded to the second device 650g. During bonding, at least one of the following combinations of features can be vertically aligned and/or at least partially coupled: (i) each of the first plurality of conductive elements 618g with a corresponding one of the second plurality of conductive elements 668g; (ii) the first continuous region 622g with the second continuous region 672g; (iii) the lowermost surface 628g of the first perimeter structure 626g with the second intermediate surface 684g of the second perimeter structure 676g; (iv) the first lateral surface 630g with the second lateral surface 686g; (v) at least a first portion of the lower surface 612g of the first insulating material layer 610g with the uppermost surface 678g of the second perimeter structure 676g; and (vi) at least a portion of a side 669g of the second plurality of conductive elements 668g with at least a portion of a third lateral surface 638g of the first perimeter structure 626g.

The above-mentioned bonds can occur in different planes. For example, the first plurality of conductive elements 618g can be directly bonded to the second plurality of conductive elements 668g in a first plane, the lowermost surface 628g of the first perimeter structure 626g can be directly bonded to the second intermediate surface 684g of the second perimeter structure 676g in a second plane, and the first plane can be vertically offset from the second plane.

Figure 6H:
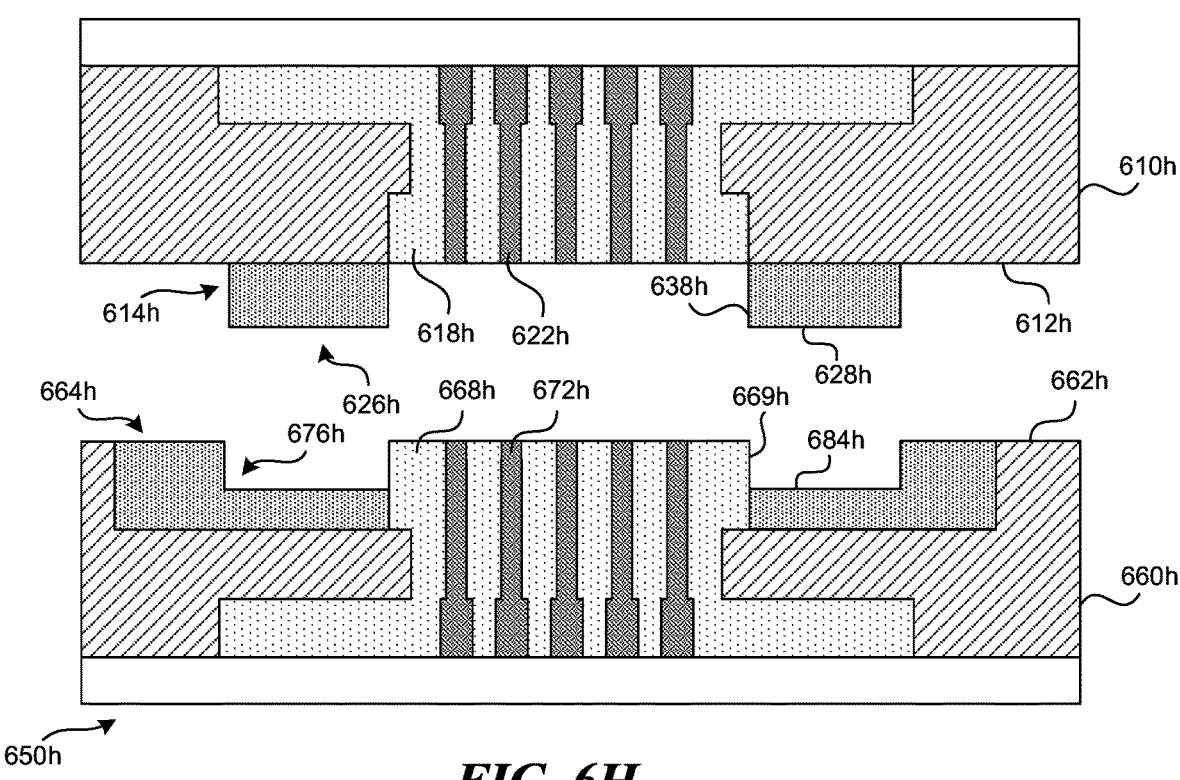

FIG. 6H illustrates a first semiconductor device 600h that can be configured similarly to the semiconductor device 600g of FIG. 6G, and a second semiconductor device 650h that can be configured similarly to the second semiconductor device 650e of FIG. 6E to correspond to the first device 600h.

The first semiconductor device 600h can be directly bonded to the second semiconductor device 650h. During bonding, the list of elements that can be vertically aligned and/or at least partially coupled to each other discussed with respect to FIG. 6G can apply equally to FIG. 6H. Additionally, the lower surface 612h of the first insulating material layer 610h can be vertically aligned with and/or coupled to at least a portion of the uppermost surface 662h of the second insulating material layer 660h.

The above-mentioned bonds can occur in different planes. For example, the first plurality of conductive elements 618h can be directly bonded to the second plurality of conductive elements 668h in a first plane, the lowermost surface 628h of the first perimeter structure 626h can be directly bonded to the second intermediate surface 684h of the second perimeter structure 676h in a second plane, and the first plane can be vertically offset from the second plane.

Figure 6I:
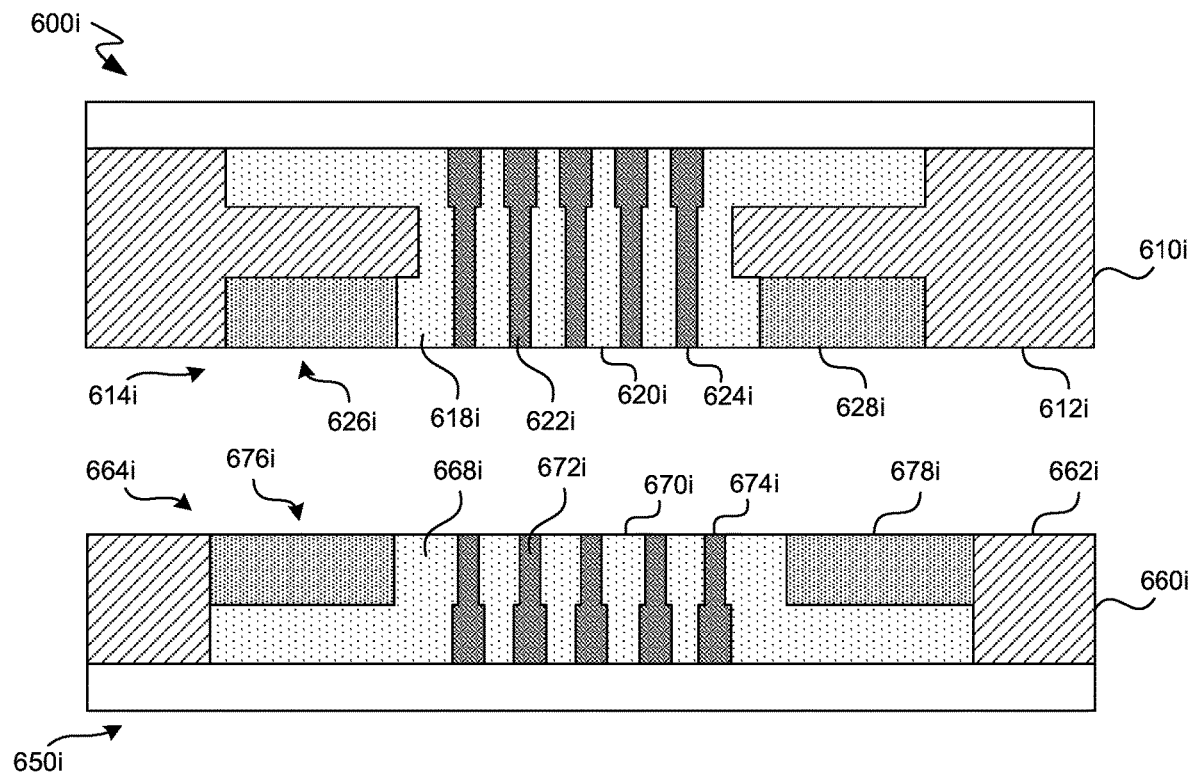

FIG. 6I illustrates a first semiconductor device 600i that can be configured similarly to the semiconductor device 400e of FIG. 4E, and a second semiconductor device 650i that can be configured to correspond to the first semiconductor device 600i. For example, the second semiconductor device 650i can include a second perimeter structure 676i having an uppermost surface 678i that can be coplanar with an uppermost surface 662i of a second insulating material layer 660i, the second end surfaces 670i of a second plurality of conductive elements 668i, and an uppermost surface 674i of a second continuous region 672i. In the illustrated embodiment, the second perimeter structure 676i can be formed at least partially over the second plurality of conductive elements 668i. In other embodiments, the second perimeter structure 676i can be formed over at least a portion of the second insulating material layer 660i. For example, the second perimeter structure 676i and second insulating material layer 660i of the second semiconductor device 650i can be configured to be generally similar to the first perimeter structure 626i and first insulating material layer 610i of the first semiconductor device 600i, or the second perimeter structure 676a of FIG. 6A.

The first semiconductor device 600i can be directly bonded to the second semiconductor device 650i. During bonding, at least one of the following combination features can be vertically aligned and/or at least partially coupled: (i) each of the first plurality of conductive elements 618i with a corresponding one of the second plurality of conductive elements 668i; (ii) the first continuous region 622i with the second continuous region 672i; (iii) the lowermost surface 628i of the first perimeter structure 626i with the uppermost surface 678i of the second perimeter structure 676i; and (iv) the lower surface 612i of the first insulating material layer 610i with the uppermost surface 662i of the second insulating material layer 660i.

The above-mentioned bonds can occur in the same plane. For example, the first plurality of conductive elements 618i can be directly bonded to the second plurality of conductive elements 668i in a first plane, the first perimeter structure 626i can be directly bonded to the second perimeter structure 676i in a second plane, and the first plane can be coplanar with the second plane. A person having ordinary skill in the art will appreciate that any of the devices disclosed herein that include fully coplanar bonds, bonding components, and/or bonding surfaces can be configured to correspond with each other.

Figure 6J:
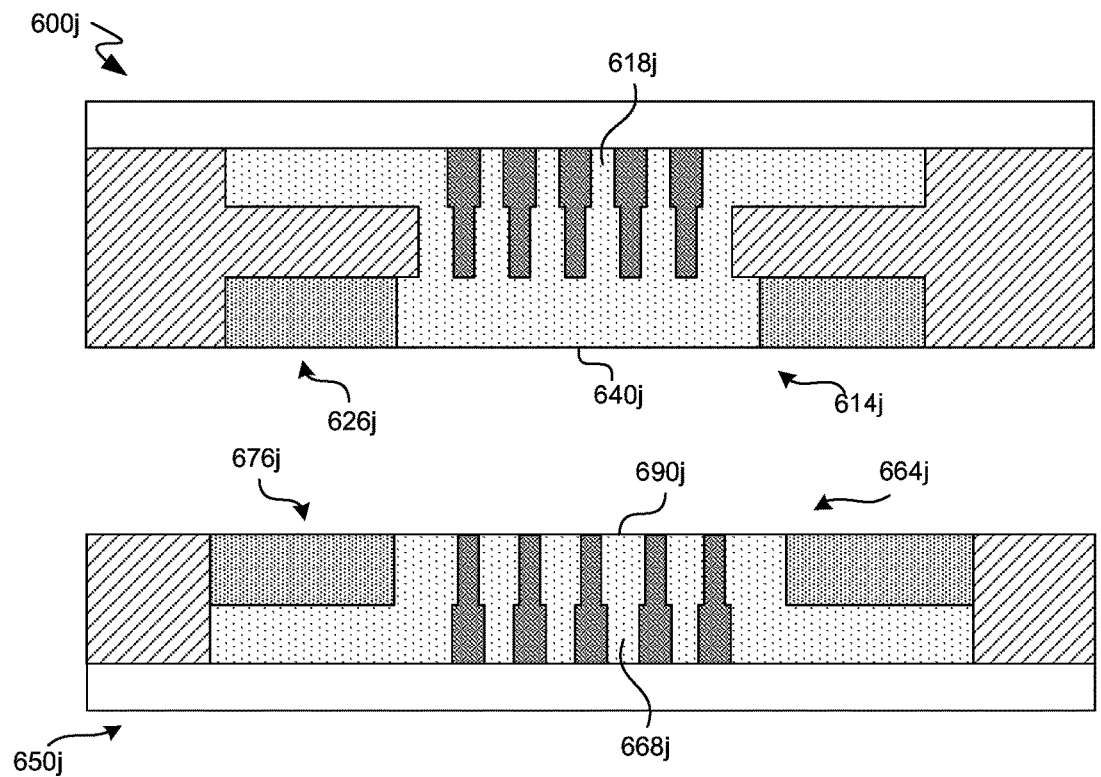

FIG. 6J illustrates a first semiconductor device 600j configured similarly to the first device 600i of FIG. 6I, and a second semiconductor device 650j configured similarly to the second device 650i of FIG. 6I to correspond to the first device 600j. However, the first semiconductor device 600j can further include a first plurality of conductive elements 618j wherein at least some of the first plurality of conductive elements 618j are electrically coupled to form a first single electrical connector 640j. The second semiconductor device 650j can further include a second plurality of conductive elements 668j wherein at least some of the second plurality of conductive elements 668j are electrically coupled to form a second single electrical connector 690j.

The first semiconductor device 600j can be directly bonded to the second semiconductor device 600j. During bonding, the list of elements that can be vertically aligned and/or at least partially coupled to each other discussed with respect to FIG. 6I can apply equally to FIG. 6J. Additionally, the first single electrical connector 640j of the first semiconductor device 600j can be vertically aligned with and/or at least partially coupled to the corresponding second single electrical connector 690j of the second semiconductor device 650j.

The above-mentioned bonds can occur in the same plane. For example, the first single electrical connector 640j can be directly bonded to the second single electrical connector 690j in a first plane, the first perimeter structure 626j can be directly bonded to the second perimeter structure 676j in a second plane, and the first plane can be vertically coplanar with the second plane. A person having ordinary skill in the art will appreciate that any of the devices disclosed herein that include fully coplanar bonds, bonding components, and/or bonding surfaces can be configured to correspond with each other. For example, the first semiconductor device 600j of FIG. 6J can be directly bonded to the second semiconductor device 650i of FIG. 6I.

Figure 7:
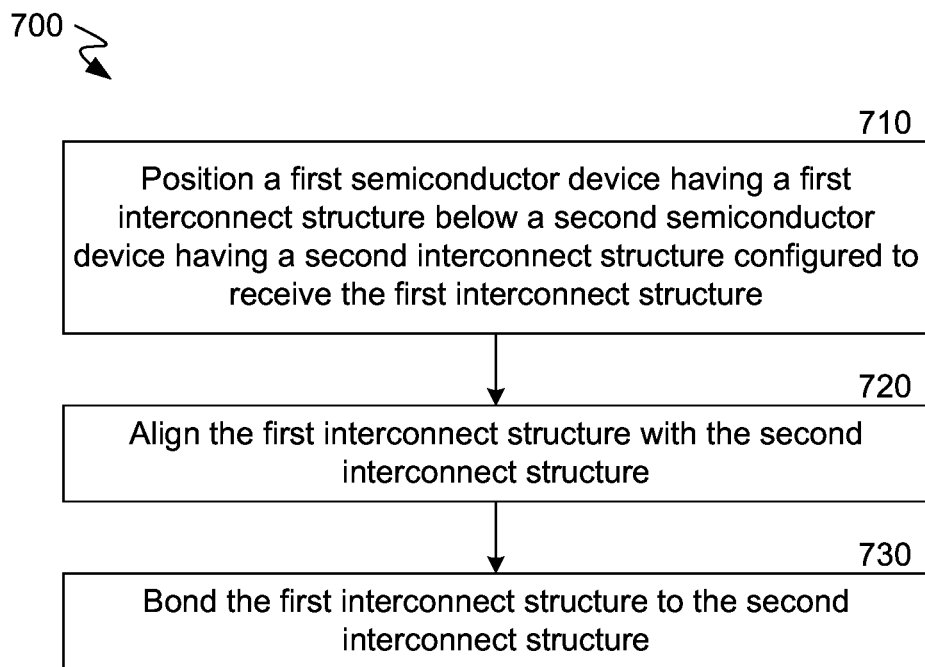
FIG. 7 is a block diagram illustrating a method of bonding a first semiconductor device to a second semiconductor device, in accordance with embodiments of the present technology.

FIG. 7 is a block diagram illustrating a method 700 of bonding a first semiconductor device to a second semiconductor device, in accordance with embodiments of the present technology. The method 700 can be used to bond any of the semiconductor devices described herein, and/or one or more components thereof (e.g., interconnect structure 314 of FIG. 3, interconnect structures 414a-g of FIGS. 4A-4G, interconnect structures 614a-j of FIGS. 6A-6J). The method 700 can be accomplished using techniques the details of which are well known to those of skill in the art.

At block 710, the method 700 includes positioning a first semiconductor device having a first interconnect structure below a second semiconductor device have a second interconnect structure. The second interconnect structure can be facing towards, and configured to receive, the first interconnect structure.

At block 720, the method 700 further includes aligning (e.g., vertically) the first interconnect structure with the second interconnect structure. Aligning the first and second interconnect structures can include aligning a first component of the first interconnect structure with a corresponding second component of the second interconnect structure. For example, the first interconnect structure can include a first perimeter structure, the second interconnect structure can include a second perimeter structure corresponding to the first perimeter structure, and the first perimeter structure can be aligned (e.g., vertically) with the second interconnect structure.

At block 730, the method 700 further includes bonding the first interconnect structure to the second interconnect structure. Bonding the first and second interconnect structures can include bonding a first component of the first interconnect structure with a corresponding second component of the second interconnect structure. For example, the first interconnect structure can include a first plurality of conductive elements, the second interconnect structure can include a second plurality of conductive elements, and the first plurality of conductive elements can be directly bonded to the second plurality of conductive elements.

Bonding the first and second interconnect structures can further include forming a first bond in a first plane, and forming a second bond in a second plane that is vertically offset from the first plane. For example, the bond between the first and second pluralities of conductive elements can be a metal-metal bond in a first plane. The first and second interconnect structures can further include respective and corresponding first and second perimeter structures that can be bonded in a first oxide-oxide bond in a second plane. The second plane can be parallel to and/or vertically offset from the first plane.

The method 700 can further include bonding, with a second oxide-oxide bond, a first dielectric layer on an upper surface of the first semiconductor device to a second dielectric layer on a lower surface of the second semiconductor device. The second oxide-oxide bond can be in a third plane, and the third plane can be vertically offset from either the first plane or the second plane.

The method 700 can further include bonding, with a third oxide-oxide bond, a first continuous region of a first insulating material at least partially between the first plurality of conductive elements and a second continuous region of a second insulating material at least partially between the second plurality of conductive elements. The third oxide-oxide bond can be formed in the first plane such that the third oxide-oxide bond is coplanar with the metal-metal bond.

Figure 8:
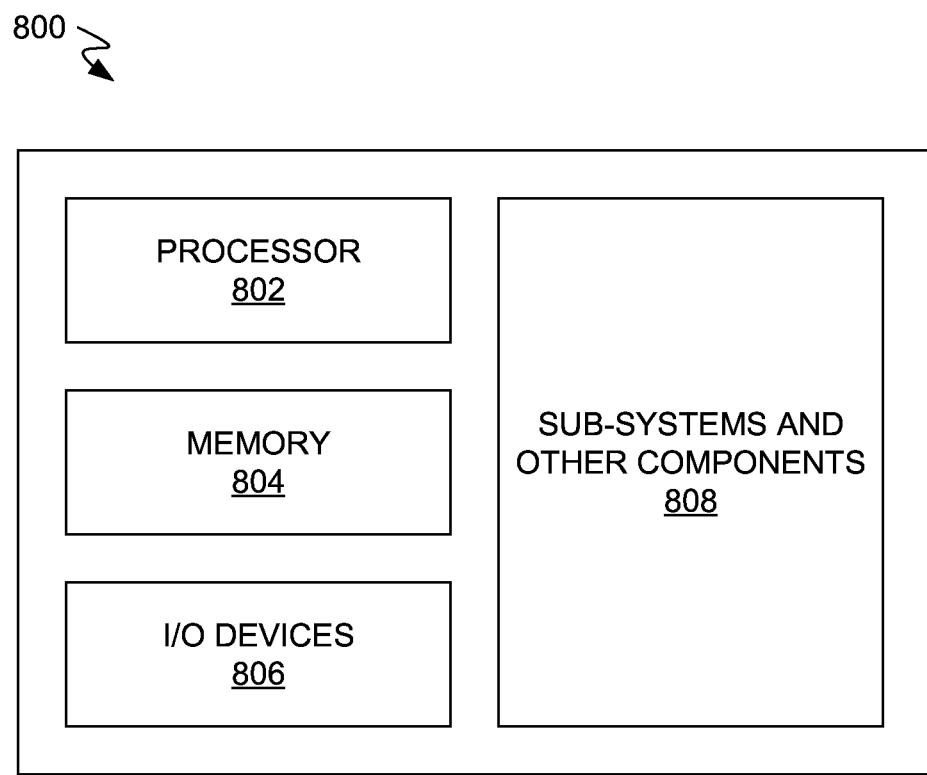
FIG. 8 is a schematic view of a system that includes a semiconductor device or package configured in accordance with embodiments of the present technology.

Any one of the semiconductor devices and/or packages having the features described above with reference to FIGS. 2-6J can be incorporated into any of a myriad of larger and/or more complex systems, a representative example of which is system 800 shown schematically in FIG. 8. The system 800 can include a processor 802, a memory 804 (e.g., SRAM, DRAM, flash, and/or other memory devices), input/output devices 806, and/or other sub-systems or components 808. The semiconductor devices, dies, and/or interconnects described above with reference to FIGS. 2-6J can be included in any of the elements shown in FIG. 8. The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other examples, the system 800 can be housed in a single unit or distributed over multiple interconnected units, e.g., through a communication network. The components of the system 800 can accordingly include local and/or remote memory storage devices and any of a wide variety of suitable computer-readable media.

Figure 9:
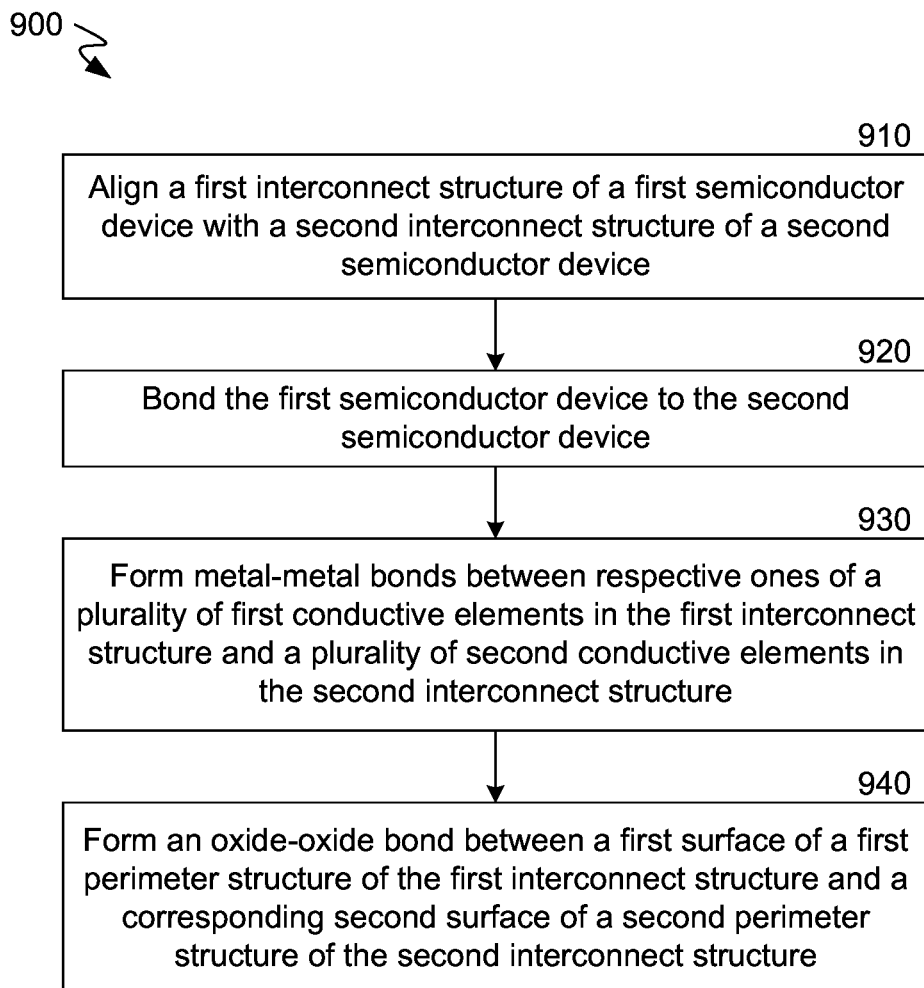
FIG. 9 is a block diagram illustrating a method of manufacturing a semiconductor device, in accordance with embodiments of the present technology.

FIG. 9 is a block diagram illustrating a method 900 of manufacturing a semiconductor device, in accordance with embodiments of the present technology. The method 900 can be used to manufacture any embodiment of the semiconductor devices described herein, and/or one or more components thereof (e.g., device 300 of FIG. 3, devices 400a-g of FIGS. 4A-4G, first devices 600a-j of FIGS. 6A-6J, second devices 650a-j of FIGS. 6A-6J). The method 900 can be accomplished using any suitable technique, including techniques whose details are well known to those of skill in the art.

At block 910, the method 900 includes aligning a first interconnect structure of a first semiconductor device with a second interconnect structure of a second semiconductor device. The second interconnect structure can correspond to the first interconnect structure such that the second interconnect structure is configured to receive the first interconnect structure. For example, the second interconnect structure can be configured similarly to or the same as the second interconnect structures 664a-j of FIGS. 6A-6J, and the first interconnect structure can be configured similarly to or the same as the first interconnect structures 614a-j of FIGS. 6A-6J. In some embodiments, the first interconnect structure can be on an upper surface of the first semiconductor device, and the second interconnect structure can be on a lower surface of the second semiconductor device.

At block 920, the method 900 further includes bonding the first semiconductor device to the second semiconductor device. The bond can be between corresponding features or components of the first and second semiconductor devices, as discussed previously with respect to FIGS. 6A-6J. For example, the upper surface of the first semiconductor device can be at least partially covered by a first dielectric material layer, the lower surface of the second semiconductor device can be at least partially covered by a second dielectric material layer, and the first dielectric material layer can correspond and be directly bonded to the second dielectric material layer.

At block 930, the method 900 further includes forming one or more metal-metal bonds between respective ones of a plurality of first conductive elements in the first interconnect structure and a plurality of second conductive elements in the second interconnect structure. The one or more metal-metal bonds can be coplanar such that they define a first plane, and the first plane can be parallel to the upper surface of the first semiconductor device and/or the lower surface of the second semiconductor device. In some embodiments, the first and second conductive elements can be formed from a same material, such as any of the conductive materials discussed previously, as well as any other suitable conductive material generally known to a person having ordinary skill in the art.

At block 940, the method 900 further includes forming a first oxide-oxide bond between a first surface of a first perimeter structure in the first interconnect structure and a corresponding second surface of a second perimeter structure of the second interconnect structure. The first oxide-oxide bond can define a second plane, and the second plane can be vertically offset from the first plane. The first and second perimeter structures can be formed from a first insulating material. The first insulating material can be any insulating material discussed previously, as well as any other suitable insulating material generally known to a person having ordinary skill in the art.

The method 900 can further include forming a second oxide-oxide bond between a first dielectric layer on the upper surface of the first semiconductor device and a second dielectric layer on the lower surface of the second semiconductor device. The second oxide-oxide bond can define a third plane, and the third plane can be offset from the first plane and/or the second plane. The first and second dielectric layers can be formed from a same dielectric material. The dielectric material can be any dielectric material discussed previously, as well as any other suitable dielectric material generally known to a person having ordinary skill in the art.

The method 900 can further include forming a third oxide-oxide bond between a first continuous region of a first insulating material at least partially between the plurality of first conductive elements and a second continuous region of a second insulating material at least partially between the plurality of second conductive elements. The third oxide-oxide bond can be coplanar with the first plane. The first and second continuous regions can be formed from a second insulating material. The second insulating material can be any insulating material discussed previously, as well as any other suitable insulating material generally known to a person having ordinary skill in the art. The second insulating material can be a same or different material than the first insulating material.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor device, comprising:
   a semiconductor substrate;
   a dielectric layer formed over the substrate, the dielectric layer having an upper surface; and
   an interconnect structure disposed in the dielectric layer, the interconnect structure including:
      a plurality of conductive elements electrically coupled to circuitry in the semiconductor substrate, the plurality of conductive elements having coplanar end surfaces,
      a continuous region of a first insulating material at least partially between the plurality of conductive elements, the region having an uppermost surface coplanar with the end surfaces, and
      a perimeter structure of a second insulating material surrounding the plurality of conductive elements and the region of the first insulating material, an uppermost surface of the perimeter structure being vertically offset from the coplanar end surfaces or the upper surface of the dielectric layer.

2. The semiconductor device of claim 1 wherein the continuous region extends at least partially between the perimeter structure and the plurality of conductive elements.

3. The semiconductor device of claim 1 wherein the perimeter structure further includes an intermediate surface being parallel to and vertically offset from the uppermost surface of the perimeter structure.

4. The semiconductor device of claim 3 wherein the intermediate surface is coplanar with the end surfaces of the conductive elements and the continuous region.

5. The semiconductor device of claim 3 wherein the perimeter structure further includes a lateral surface extending from the uppermost surface to the intermediate surface.

6. The semiconductor device of claim 3 wherein the intermediate surface is vertically offset from the upper surface of the dielectric layer.

7. The semiconductor device of claim 1 wherein at least some of the plurality of conductive elements are electrically coupled.

8. The semiconductor device of claim 1 wherein the dielectric layer is formed from the first insulating material.

9. The semiconductor device of claim 1 wherein the second insulating material is different from the first insulating material.

10. A semiconductor device assembly, comprising:
    a first semiconductor device including a first semiconductor substrate and a first dielectric layer formed over the first semiconductor substrate;
    a second semiconductor device including a second semiconductor substrate and a second dielectric layer formed over the second semiconductor substrate; and
    an interconnect structure coupling the first semiconductor device to the second semiconductor device, the interconnect structure comprising:
       a first plurality of conductive elements of the first semiconductor device, each directly bonded in a first bonding plane to a corresponding one of a second plurality of conductive elements of the second semiconductor device, and
       a first perimeter structure of the first semiconductor device, the first perimeter structure surrounding the first plurality of conductive elements and directly bonded in a second bonding plane to a second perimeter structure of the second semiconductor device, the second perimeter structure surrounding the second plurality of conductive elements,
       wherein the first bonding plane is vertically offset from the second bonding plane.

11. The semiconductor device assembly of claim 10 wherein the first dielectric layer is directly coupled to the second dielectric layer in one of the first or second bonding planes.

12. The semiconductor device assembly of claim 10 wherein the interconnect structure further comprises:
    a first continuous region of a first insulating material at least partially between the first plurality of conductive elements, and
    a second continuous region of a second insulating material at least partially between the second plurality of conductive elements,
    wherein the first continuous region is bonded to the second continuous region in the first bonding plane.

13. The semiconductor device assembly of claim 12 wherein:
    the first and second dielectric layers comprise a first dielectric material,
    the first insulating material is the same as the second insulating material,
    the first and second perimeter structures comprise a third insulating material different from the first and second insulating materials, and
    the first and second pluralities of conductive elements comprise the same conductive material.

14. The semiconductor device assembly of claim 10 wherein:
    the first perimeter structure further includes a first intermediate surface,
    the second perimeter structure further includes an uppermost surface,
    the first intermediate surface is directly bonded in a third bonding plane to the uppermost surface of the second perimeter structure, and
    the third bonding plane is parallel to and offset from the second bonding plane.

15. The semiconductor device assembly of claim 14 wherein:
    the first perimeter structure further includes a first lateral surface between the first intermediate surface and the second bonding plane,
    the second perimeter structure further includes a second lateral surface between the second uppermost surface and the second bonding plane, and
    the first lateral surface is directly bonded to the second lateral surface.

16. The semiconductor device assembly of claim 10 wherein:
    the plurality of first conductive elements are coupled to the plurality of second conductive elements by a metal-metal bond, and
    the first perimeter structure is coupled to the second perimeter structure by an oxide-oxide bond.

17. A method for manufacturing a semiconductor device assembly, comprising:
    aligning a first interconnect structure on an upper surface of a first semiconductor device with a second interconnect structure on a lower surface of a second semiconductor device, the second interconnect structure being configured to receive the first interconnect structure; and bonding the first semiconductor device to the second semiconductor device by:
forming, in a first plane, metal-metal bonds between respective ones of a plurality of first conductive elements in the first interconnect structure and a plurality of second conductive elements in the second interconnect structure, and
forming, in a second plane, a first oxide-oxide bond between a first surface of a first perimeter structure in the first interconnect structure and a corresponding second surface of a second perimeter structure of the second interconnect structure, wherein the second plane is vertically offset from the first plane.

18. The method of claim 17, further comprising forming, in a third plane, a second oxide-oxide bond between a first dielectric layer on the upper surface of the first semiconductor device and a second dielectric layer on the lower surface of the second semiconductor device, wherein the third plane is offset from the first plane and/or the second plane.

19. The method of claim 17, further comprising forming, in the first plane, a second oxide-oxide bond between a first continuous region of a first insulating material at least partially between the plurality of first conductive elements and a second continuous region of a second insulating material at least partially between the plurality of second conductive elements.

20. The method of claim 19 wherein:
the first and second conductive elements comprise a same material,
the first and second perimeter structures are formed from a first insulating material, and
the first and second continuous regions are formed from a second insulating material different from the first insulating material.

* * * * *